United States Patent
Hamamoto et al.

(10) Patent No.: US 7,164,602 B2
(45) Date of Patent: Jan. 16, 2007

(54) NONVOLATILE SEMICONDUCTOR MEMORY DEVICE INCLUDING HIGH EFFICIENCY AND LOW COST REDUNDANT STRUCTURE

(75) Inventors: Takeshi Hamamoto, Hyogo (JP); Hidenori Mitani, Hyogo (JP); Taku Ogura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 321 days.

(21) Appl. No.: 10/941,028

(22) Filed: Sep. 15, 2004

(65) Prior Publication Data

US 2005/0104103 A1   May 19, 2005

(30) Foreign Application Priority Data

Sep. 16, 2003  (JP) .............................. 2003-323352

(51) Int. Cl.
    *G11C 11/34* (2006.01)
(52) U.S. Cl. ........................... 365/185.09; 365/185.01; 365/185.13; 365/185.19; 365/185.22
(58) Field of Classification Search ........... 365/185.09, 365/185.01, 185.13, 185.22, 185.19
    See application file for complete search history.

(56) References Cited

U.S. PATENT DOCUMENTS 6,215,699 B1 *  4/2001  Yamamoto ............. 365/185.09
6,868,008 B1 *  3/2005  Kamei et al. .......... 365/185.09

FOREIGN PATENT DOCUMENTS

| JP | 8-249900 | 9/1996 |
|---|---|---|
| JP | 10-241396 | 9/1998 |

* cited by examiner

*Primary Examiner*—Van Thu Nguyen
*Assistant Examiner*—Pho M. Luu
(74) *Attorney, Agent, or Firm*—McDermott Will & Emery LLP

(57) ABSTRACT

The PROM area is adjacent to the normal memory cell area. The data writing (normal writing) and the data reading (normal reading) for normal memory cell areas and the data writing (redundant writing) for the PROM area are carried out from the side of the normal memory cell areas. The data reading (redundant reading) for the PROM area is carried out from the side of the PROM area. In the PROM area, the PROM cells having the same structure as that of the normal memory cells are connected to the redundant sub bit lines. In the redundant writing, in the select gate area, the redundant sub bit lines and main bit lines are connected. In the redundant reading, in the redundant gate area having the same layout as that of the select gate area, the redundant sub bit lines are connected to redundant bit lines.

15 Claims, 14 Drawing Sheets

NONVOLATILE SEMICONDUCTOR MEMORY DEVICE INCLUDING HIGH EFFICIENCY AND LOW COST REDUNDANT STRUCTURE

BACKGROUND OF THE INVENTION

1. Field of the Invention

The present invention relates to a nonvolatile semiconductor memory devices and, more particularly, to a nonvolatile semiconductor memory device including a redundant structure.

2. Description of the Background Art

Semiconductor memory devices (hereinafter, referred to as semiconductor memories or semiconductor memory chips) are tested for proper operation after the fabricating processes have been completed and prior to shipment, and as the results of such tests, devices capable of proper operations are sorted out from defective devices.

In such tests, even if there partially exists a defective circuit portion, the defective portion is substituted with a specific defective-portion substituting circuit to eliminate the defection and then fine adjustments for ensuring proper operation (hereinafter, referred to as trimming) are made. In general, such a defective-portion substituting circuit is referred to as a redundant circuit and substitution relief utilizing a redundant circuit is referred to as redundant substitution.

Further, in the aforementioned tests, there may be a case where semiconductor memory devices to be tested have electric characteristics which are out of specs required for proper operations. In this case, similarly, trimming of electric characteristics is performed using specific adjustment circuits to satisfy the required specs for these devices and these devices are shipped as devices capable of normal operation. Such adjustment circuits are also one type of redundant circuits in a broad sense.

As a trimming method for use in redundant substitution as described above, a laser trimming method is often employed. The laser trimming method is a method which, based on the results of operation tests performed after the semiconductor fabricating processes, programs the fuse element by laser blowing for electrically substituting the defective portions with redundant circuits or for adjusting the electric characteristics of the detective portions. In the fuse element, there is nonvolatily stored redundant information including information about the presence or absence of defective circuit portions and information for identifying the defective portions (see, for example, Japanese Patent Laying-Open Nos. 10-241396 and 08-249900).

While the laser trimming method may ensure excellent fabrication quality, it has the following problems since it involves a laser blow process for programming.

The first problem is that the layout size can not be reduced since there are restrictions that the size of fuse element can not be reduced to be smaller than the spot diameter of the directed laser and that there must be a sufficient clearance in the layout for preventing influences of the thermal fuse blowing on the adjacent fuse element. Particularly, in order to program a large amount of information, the layout size of the redundant circuit must be large, and accordingly the chip area of the device itself must be increased. Increases in the chip area directly result in increases in the fabricating cost.

The second problem is that since wirings can not be run through the layers over the area in which the fuse element is provided, an area for diverting wirings is further required. This is because the laser blowing process is performed by directing a laser light ray onto the upper surface of the chip. This also requires increasing the chip area.

The third problem is that redundant substitution can not be performed for defections generated after a molding process. Once the chip has been encapsulated into a mold package, a laser light ray can not be directed to the upper surface of the chip, and therefore programming can not be performed.

The fourth problem is that redundant substitution can not be performed for defections generated after programming. Programming is performed by blowing out the fuse element by laser blowing, and therefore once the programming has been completed, programming can not be performed again even if a further defection is generated.

The fifth problem is that the laser programming requires a specific laser blowing device, thereby increasing the cost of the device.

The aforementioned problems may induce increases in the fabricating cost of the semiconductor device.

Therefore, as a means for avoiding these problems, there has been suggested a redundant circuit employing nonvolatile memory cells as program elements. Particularly, in nonvolatile semiconductor memory devices such as flash memories, the main part of the storage element is constituted by volatile memory cells, and therefore the nonvolatile memory cells may be utilized as the program element of the storage element.

In redundant substitution for a nonvolatile semiconductor memory device, as previously described, nonvolatile memory cells may be utilized as a program element to perform programming without involving a laser blowing process, thereby avoiding the aforementioned problems. On the other hand, in nonvolatile semiconductor memory devices, new problems will be generated as follows.

Generally, writing into nonvolatile memory cells involves complex programming sequences and therefore requires a number of specific circuits for realizing the programming operations. Particularly, flash memories and EEPROMs (Electrically Erasable Programmable Read-Only Memories) require a relatively high electric voltage for the programming operation, and therefore the specific circuits for programming require a significantly large layout area. Accordingly, it is desirable that the circuits for performing reading/writing/erasing operations for the areas which performs normal memory operations (hereinafter, referred to as normal memory cell areas) are also utilized as the circuits for performing reading/writing/erasing operations for the nonvolatile memory cell area (hereinafter, referred to as a PROM area) for use as the storage element for redundant information (information about redundant substitution and electrical characteristics adjustments).

The reading of program information for the PROM area must be performed at power-on of the volatile semiconductor memory device. This is because when performing the normal memory operations from outside, namely the reading/writing/erasing operations for the normal memory cell areas, it is required that redundant information has been already read out and the setting of the redundant circuit has been completed. Therefore, at power-on of the volatile semiconductor memory device, the program information must been read out from the PROM area in advance to complete various setting.

However, at power-on, the power supply voltage VCC supplied from outside (hereinafter, referred to as an external power supply voltage) and the power supply voltage which is generated within the chip by supplying the external power supply voltage to the chip (hereinafter, referred to as an internal power supply voltage INTVCC) have not been stabilized. This makes difficult to perform the reading operation for the PROM area using the same procedure as that for the data reading operation for the normal memory cell area, which is performed under a stable external power supply voltage and stable internal power supply voltage. Therefore, it is desirable that the reading operation for the PROM area is performed using paths separated from those for the reading operation for the normal memory cell areas and also using a specific reading circuit for the PROM area.

However, if data reading for the PROM area is performed using paths separated from those for reading for the normal memory cell area, it is a new task to ensure stable reading operation under unstable biasing conditions at power-on.

SUMMARY OF THE INVENTION

Therefore, it is an object of the present invention to provide a nonvolatile semiconductor memory device which enables stable and accurate reading of redundant information stored in nonvolatile memories to realize high efficiency and low cost redundant relief.

The nonvolatile semiconductor memory device includes an memory array including a plurality of normal memory cells and a plurality of redundant memory cells for substitution relief of defective memory cells among the plurality of normal memory cells, the plurality of normal memory and the plurality of redundant memory cells being arranged in a matrix shape; a program circuit for storing redundant information for use in substitution relief, which is placed adjacent to said memory array in the direction of the memory cell columns. The program circuit includes a plurality of program cells arranged in a matrix shape and having the same structure as that of said normal memory cells, a plurality of sub bit lines provided in correspondence with the respective columns of said program cells, a plurality of program word lines provided in correspondence with the respective rows of said program cells, main bit lines which are shared by the normal memory cells and the program cells, and redundant reading bit lines for reading the redundant information from the program circuit. The nonvolatile semiconductor memory device further includes a first connecting circuit for electrically connecting the main bit lines with selected sub bit lines designated to be written, of the plurality of sub bit lines, in program information writing operation for writing the redundant information into the program circuit, and a second connecting circuit for electrically connecting the redundant reading bit lines with selected sub bit lines designated to be read, of the plurality of sub bit lines, in program information reading operation for reading the redundant information from the program circuit before data reading operation.

With the nonvolatile semiconductor memory device according to the present invention, redundant information is stored in the nonvolatile memories constituting the program circuit, and the redundant information is read through paths separated from those for the reading operation for the normal memory cells prior to the normal data reading operation to realize accurate and stable reading operation, enabling high efficiency and low cost redundant relief.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
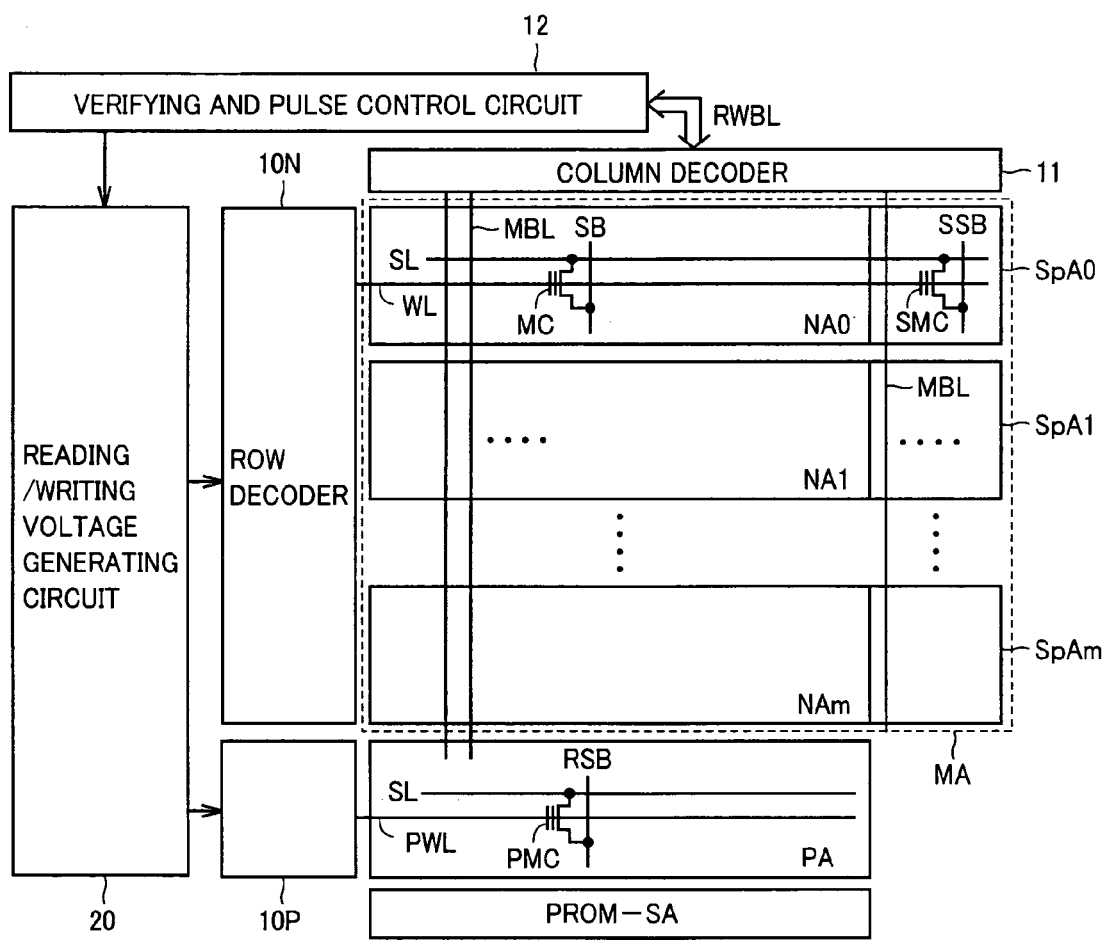
FIG. 1 is a schematic block diagram illustrating the structure of the memory array of the nonvolatile semiconductor memory device according to the first embodiment of the present invention.

Embodiments of the present invention will be described with reference to the drawings. In the drawings, the same reference characters will denote the same or corresponding portions and the description thereof will not be repeated.

First Embodiment

FIG. 1 is a schematic block diagram illustrating the structure of a nonvolatile semiconductor memory device according to the first embodiment of the present invention.

Referring to FIG. 1, the nonvolatile semiconductor memory device includes a memory array MA and a PROM area PA. The memory array MA includes normal memory cell areas NA0 to NAm (m is a natural number greater than 1) each including a plurality of normal memory cells (hereinafter, referred to as memory cells) MC placed in a matrix shape and redundant memory cell areas SpA0 to SpAm each including redundant memory cells SMC for relieving memory cells having a defect. The PROM area PA includes PROM (Programmable Read Only Memory) cells PMC as program circuits for nonvolatily storing redundant information such as address information identifying defective memory cells. Hereinafter, normal memory cell areas NA0 to NAm and redundant memory cell areas SpA0 to SpAm will be comprehensively represented by the characters NA and SpA, respectively.

Normal memory cell areas NA and redundant memory cell areas SpA are placed such that memory cells MC and the corresponding redundant memory cells SMC share the corresponding memory cell rows. In normal memory cell areas NA, sub bit lines SB and main bit lines MBL are provided in correspondence with the respective memory cell columns. In redundant memory cell areas SpA, spare sub bit lines SSB and main bit lines MBL are provided in correspondence with the respective memory cell columns. Further, word lines WL and source lines SL are provided such that the respective memory cell rows and the corresponding redundant memory cell rows share the corresponding word lines WL and source lines SL.

Normal memory cell areas NA and PROM area PA are placed such that memory cells MC and the corresponding PROM cells PMC share the corresponding memory cell columns. As illustrated in FIG. 1, main bit lines MBL are extended across normal memory cell areas NA and PROM area PA. A plurality of redundant sub bit lines RSB are provided in correspondence with the respective PROM cell columns in PROM area PA.

Memory cells MC, redundant memory cells SMC and PROM cells PMC are nonvolatile memory cells having the same structure. In the present embodiment, memory cells MC, redundant memory cells SMC and PROM cells PMC are transistors each having a floating gate and a variable threshold voltage. The structures of these transistors will be described later in detail.

The nonvolatile semiconductor memory device further includes a column decoder 11, row decoders 10N and 10p, a verify/pulse control circuit 12, a reading/writing voltage generating circuit 20 and a PROM sense amplifier PROM-SA provided for PROM area PA.

Row decoder 10N receives row addresses and selectively activates word lines WL in reading/writing/erasing operations for normal memory cell areas NA, while row decoder 10P receives row addresses and selectively activates word lines PWL in reading/writing/erasing operations for PROM area PA.

Verify/pulse control circuit 12 is a section for controlling the erase verifying operation and the writing operation via a read/write bit line RWBL. Verify/pulse control circuit 12 includes a verifying circuit, not shown, having an erase verifying function for determining whether or not the retained information in a block to be erased has been erased and an over erase verifying function for determining whether or not memory cells have been over-erased. Verify/pulse control circuit 12 further includes a verifying sense amplifier, and a pulse control circuit for controlling voltage pulses which are applied to main bit lines MBL in the writing operation, which are not shown.

Reading/writing voltage generating circuit 20 is fed with an external power supply voltage and generates word line voltages required for reading/writing/erasing operations for normal memory cell areas NA and PROM area PA. These word line voltage levels are controlled by control signals from verify/pulse control circuit 12. The generated word line voltages are applied to selected word lines WL and selected program word lines PWL through row decoders 10N and 10P respectively, as illustrated in FIG. 1.

PROM sense amplifier PROM-SA amplifies the voltages of selected redundant sub bit lines RSB to generate read data, in reading redundant information from PROM area PA.

Figure 2:
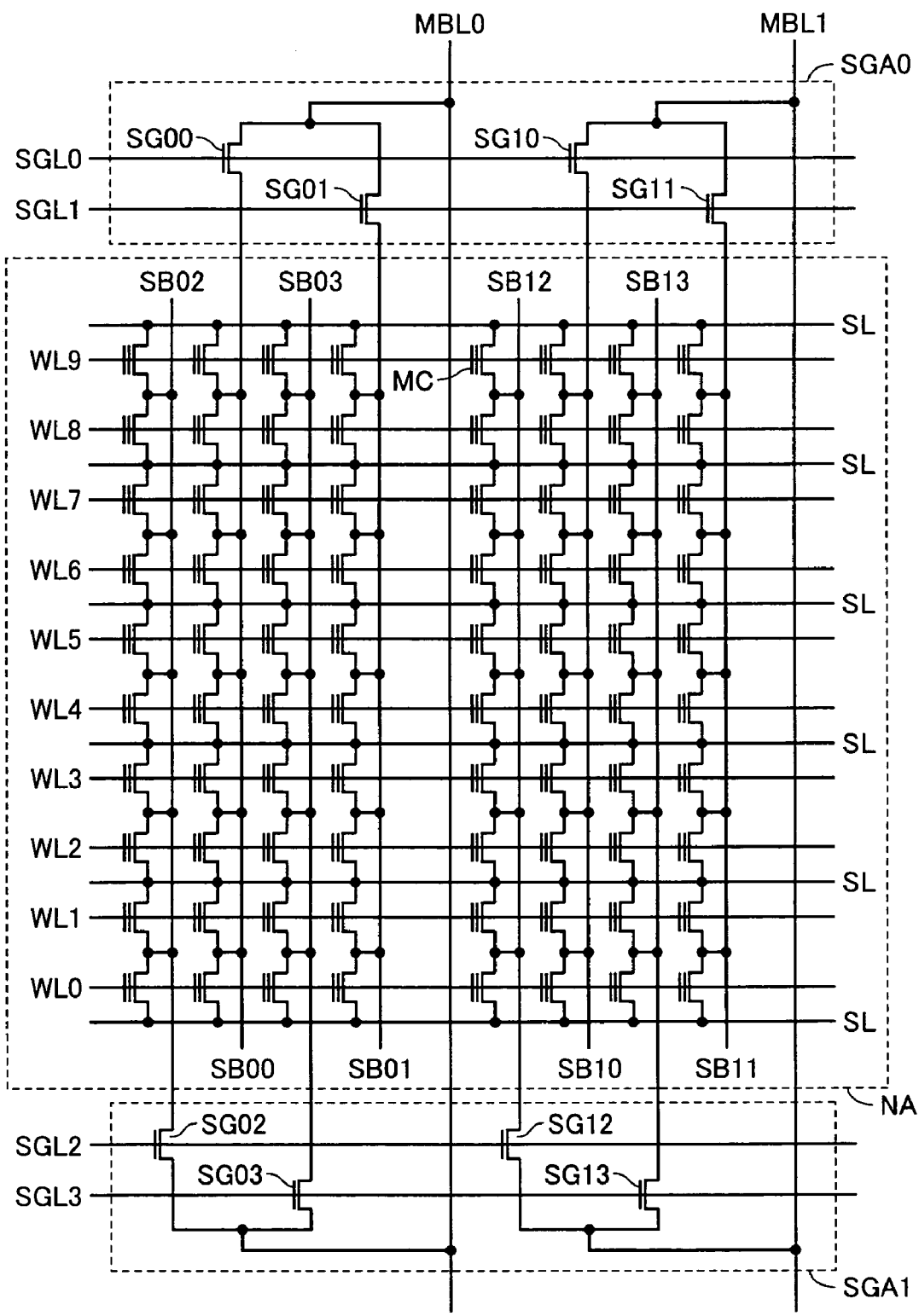
FIG. 2 is a circuit diagram illustrating the structure of normal memory cell areas NA in the nonvolatile semiconductor memory device of FIG. 1.

FIG. 2 is a circuit diagram illustrating the structure of normal memory cell areas NA in the nonvolatile semiconductor memory device of FIG. 1. FIG. 2 illustrates an exemplary circuit structure of the memory array in a NOR type flash memory.

Referring to FIG. 2, normal memory cell areas NA include a plurality of so-called floating gate type memory cells MC, which are placed in a matrix shape. In correspondence with the respective memory cell columns, sub bit lines SB 00 to SB03, SB10 to SB 13, . . . and main bit lines MBL0, MBL1, . . . are provided. In correspondence with the respective memory cell rows, word lines WL0 to WL9, . . . and source lines SL are provided. Hereinafter, sub bit lines SB 00 to SB03, SB10 to SB 13, . . . and main bit lines MBL0, MBL1, . . . will be comprehensively represented by the characters SB and MBL, respectively.

The control gates of the respective memory cells MC are connected to the corresponding word lines WL for selecting memory cells MC. The drains and sources of memory cells MC are connected to the corresponding sub bit lines SB and source lines SL, respectively.

Main bit line MBL0 is connected to sub bit lines SB00 to SB03 through select gate transistors SG00 to SG03 provided in correspondence with the respective memory cell columns. Main bit line MBL1 is connected to sub bit lines SB10 to SB13 through select gate transistors SG10 to SG13 provided in correspondence with the respective memory cell columns. Also, main bit line MBL2 and the other main bit lines, not shown, are similarly connected to four sub bit lines through four select gate transistors provided in correspondence with the respective memory cell columns. Hereinafter, select gate transistors SG00 to SG03, SG10 to SG 13, . . . will be comprehensively represented by the character SG.

Select gate transistors SG00 to SG03 turn on in response to the corresponding one of select gate selecting lines SGL0 to SGL3 being activated. Select gate selecting lines SGL0 to SGL3 are selectively activated according to the results of column selections. For example, select gate SG00 turns on in response to the corresponding select gate selecting line SGL0 being activated to "H" (logical high) level to electrically connect sub bit line SB00 with main bit line MBL0.

Similarly, select gate transistors SG10 to SG13 selectively turn on, in response to the corresponding select gate selecting lines SGL0 to SGL3 being activated, to electrically connect the corresponding sub bit lines SB10 to SB13 with main bit line MBL1.

With such a structure, main bit lines MBL are shared by a plurality of sub bit lines SB, which allows access to the sub bit lines SB corresponding to selected memory cell columns from main bit lines MBL for performing the data reading operation and the data writing operation. Hereinafter, the areas in which select gate transistors SG are provided will be referred to as select gate areas SGA. In FIG. 2, select gate areas SGA0 and SGA1 are provided adjacent to the opposite sides of normal memory cell areas NA in the direction of the memory cell columns.

On the other hand, the data erasing operation is not performed for the individual memory cells but for the entire array collectively. Therefore, the data erasing operation is performed not through particular select gate transistors SG.

Figure 3:
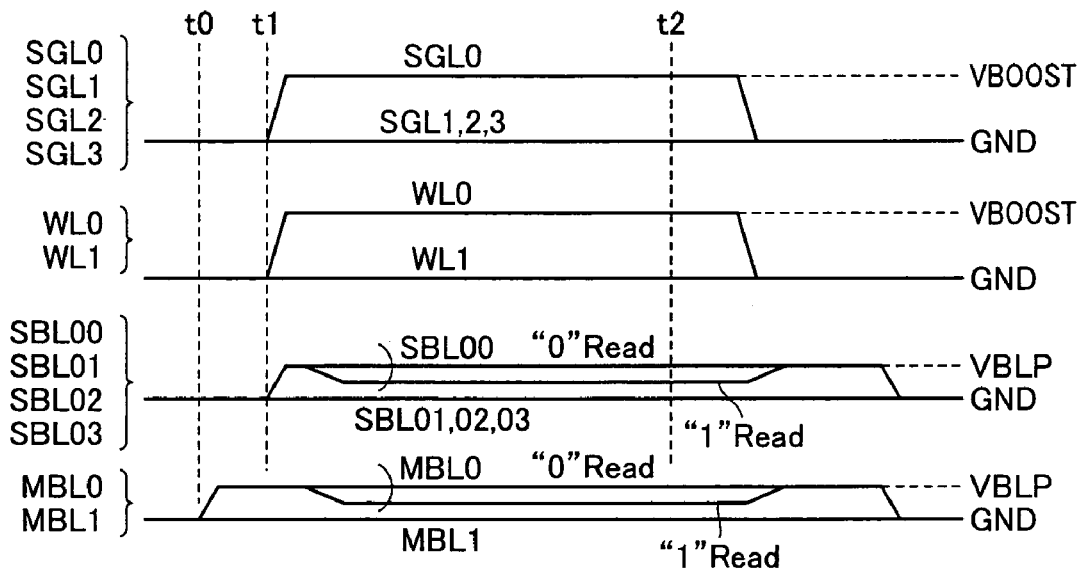
FIG. 3 is an operating waveform diagram for describing the data reading operation for normal memory cells areas NA illustrated in FIG. 2.

FIG. 3 is an operating waveform diagram for describing the data reading operation for normal memory cells areas NA illustrated in FIG. 2. There will be described, as an example, an operation for reading the data "1" or "0" from a memory cell selected through sub bit line SB00 and word line WL0.

Referring to FIG. 3, at the time t0, main bit line MBL0 selected by an externally input address is set to a predetermined reading voltage VBLP. At this time, main bit line MBL1, which is not selected, is fixedly set to a ground voltage GND.

Then, at the time t1, a predetermined internally-generated voltage VBOOST for data reading is applied to word line WL0 selected by an externally input address. Consequently, the control gate of the corresponding memory cell MC is set to the internally-generated voltage VBOOST level. Internally-generated voltage VBOOST is a boosted voltage generated within the chip and is set to about 6.5 V in the case of a power supply voltage of 1.8 V.

Further, in response to select gate selecting line SGL0 being activated to the internally-generated voltage VBOOST level, the corresponding gate transistor SG00 turns on to electrically connect main bit line MBL0 with sub bit line SB00. Consequently, sub bit line SB0 is set to reading voltage VBLP.

In the memory cell MC, reading voltage VBLP and internally-generated voltage VBOOST are properly set in consideration of the threshold voltage of the memory cells MC in which data has been written so that the reading of stored data is performed by detecting the electric current which flows depending on the presence or absence of written data.

More specifically, in the data written state, or in the state where the data "0" has been stored, the threshold voltage is high and therefore the memory cell MC does not turn on, retaining the electric charge which has been precharged. Consequently, the electrical potential of sub bit line SB00 is not changed, and therefore the electrical potential of main bit line MBL0 is maintained at the reading voltage VBLP level.

On the other hand, in the data erased state, or the state where the data "1" has been stored, the threshold voltage is low and therefore the memory cell MC turns on. Consequently, the electrical charge which has been precharged is discharged to the source line SL through the memory cell MC. Thus, the electrical potential of sub bit line SB00 is lowered by the discharge. Accordingly, the electrical potential of main bit line MBL0 is also lowered.

Therefore, at the time t2 which is sufficiently later than the time t1, the amount of the electrical charge left at main bit line MBL0 may be detected in the sense amplifier connected to main bit lines MBL for carrying out the data reading for the memory cell MC to be read.

Figure 4:
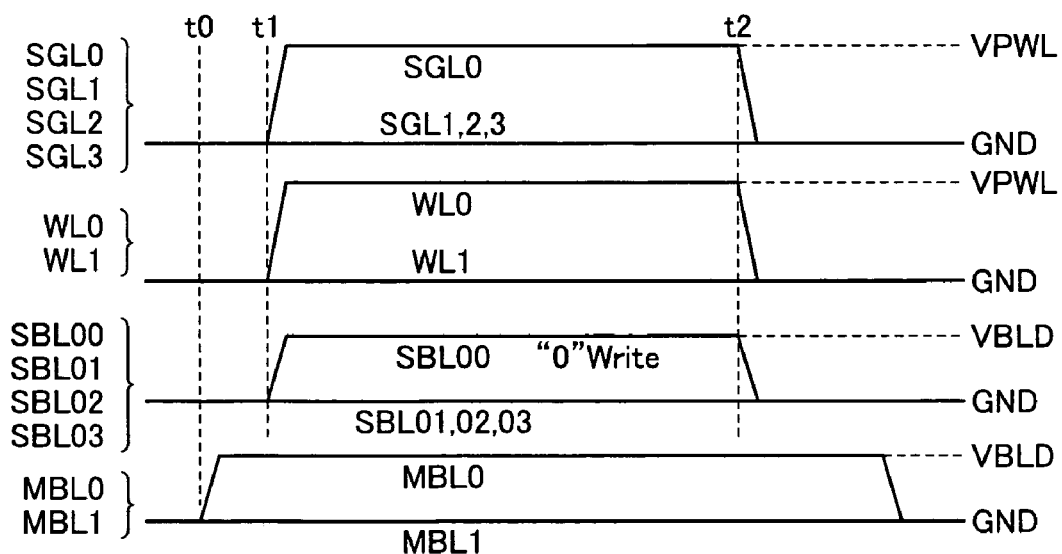
FIG. 4 is an operating waveform diagram for describing the writing operation for normal memory cells NA illustrated in FIG. 2.

FIG. 4 is an operating waveform diagram for describing the writing operation for normal memory cells NA illustrated in FIG. 2. There will be described, as an example, the operation for writing the data "0" into a memory cell storing the data "1" which is placed at the intersection of sub bit line SB00 and word line WL0.

Referring to FIG. 4, at the time t0, main bit line MBL0 selected by an externally input address is set to a predetermined writing voltage VBLD. At this time, main bit line NMBL1 not selected is fixedly set to a ground voltage GND.

Then, at the time t1, a predetermined internally-generated voltage VPWL for data writing is applied to word line WL0 selected by an externally input address. Consequently, the control gate of the corresponding memory cell is set to the internally-generated voltage VPWL level. Word line WL1 not selected is maintained at the ground voltage GND.

Further, in response to select gate selecting line SGL0 being activated to the internally-generated voltage VPWL level, the corresponding select gate transistor SG00 turns on, thus electrically connecting main bit line MBL0 with sub bit line SB00. Consequently, sub bit line SB0 is set to writing voltage VBLD.

Until the time t2 which is sufficiently later than the time t1, internally-generated voltage VPWL and writing voltage VBLD are applied to the control gate and the drain of the memory cell MC to be written. In the memory cell MC to be written, hot electrons generated near the drain are injected into the floating gate, which raises the threshold voltage. Thus, the data writing is carried out.

Figure 5:
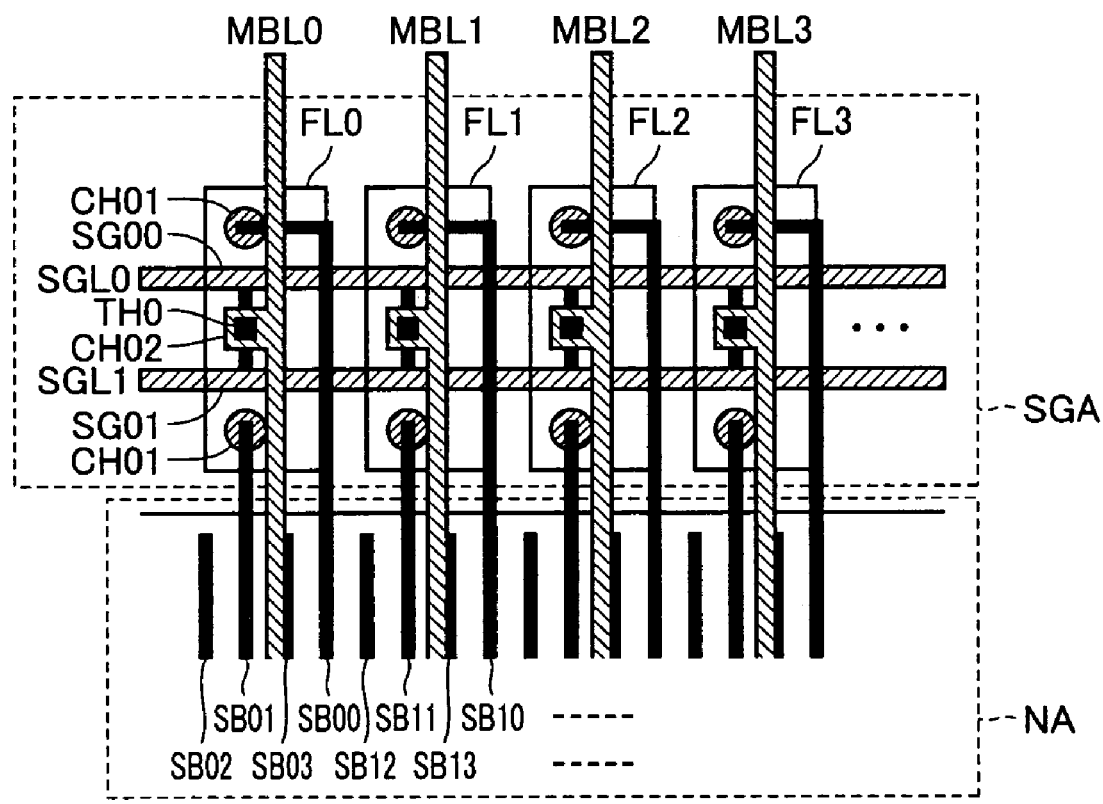
FIG. 5 is an illustration of an exemplary layout of select gate area SGA0 provided adjacent to normal memory cell areas NA illustrated in FIG. 2.

FIG. 5 is an illustration of an exemplary layout of select gate area SGA0 provided adjacent to normal memory cell areas NA illustrated in FIG. 2.

Referring to FIG. 5, in select gate area SGA0, there are provided main bit lines MBL0 to MBL3 which are extended from normal memory cell areas NA. There are activation areas FL0 to FL3 formed under main bit lines MBL0 to MBL3, respectively.

Select gate selecting lines SGL0 and SGL1 are provided to be shared by the plurality of activation areas FL.

In activation areas FL, there are formed select gate transistors SG for electrically connecting sub bit lines SB with main bit lines MBL in response to select gate selecting lines SGL0, SGL1 being activated. For example, in activation area FL0 illustrated in FIG. 5, there are formed select gate transistors SG00 and SG01 for electrically connecting sub bit lines SB00, SB01 with main bit line MBL0.

Select gate transistor SG00 is a MOS (Metal Oxide Semiconductor) transistor and is connected at its gate to select gate selecting line SGL0. Select gate transistor SG00 is also connected at its source to sub bit line SBL00 disposed at a lower metal layer, through a contact hole CH01. The drain of select gate transistor SG00 is connected to main bit line MBL0 disposed at an upper metal layer through a contact hole CH02.

Similarly, select gate transistor SG01 is connected at its gate to select gate selecting line SGL1 and is connected at its source to sub bit line SB01 through a contact hole CH01. The drain of select gate transistor SG01 is connected to main bit line MBL01 though a contact hole CH02.

By employing the layout illustrated in FIG. 5, the pitch of select gate transistors SG is reduced to one fourth the pitch of sub bit lines SB. However, since the sub bit lines SB are arranged with the same pitch as that of the memory array, the pitch of sub bit lines SB will be further reduced with advancing miniaturization. It will become difficult to further reduce the pitch and the gate width of select gate transistors SG in order to reduce the pitch of the arrangement of select gate transistors SG, for coping with such miniaturization.

In order to arrange the memory array of the normal memory cell areas having the aforementioned structure and the memory array of the PROM area in a single semiconductor memory device, the data writing for the PROM area may be performed through main bit lines MBL similarly to the data writing for the normal memory cell areas so that the circuits for performing the writing and erasing operations for the normal memory cell areas, such as verify/pulse control circuit 12 illustrated in FIG. 1, may be similarly utilized for the data writing for the PROM area, as suggested as the first problem. On the other hand, for data reading for the PROM area, it is necessary to provide paths other than main bit lines MBL for the normal memory cell areas, in view of safety of the power supply.

Therefore, in the first embodiment of the present invention, there will be described an exemplary arrangement of the memory array for solving this problem.

Figure 6:
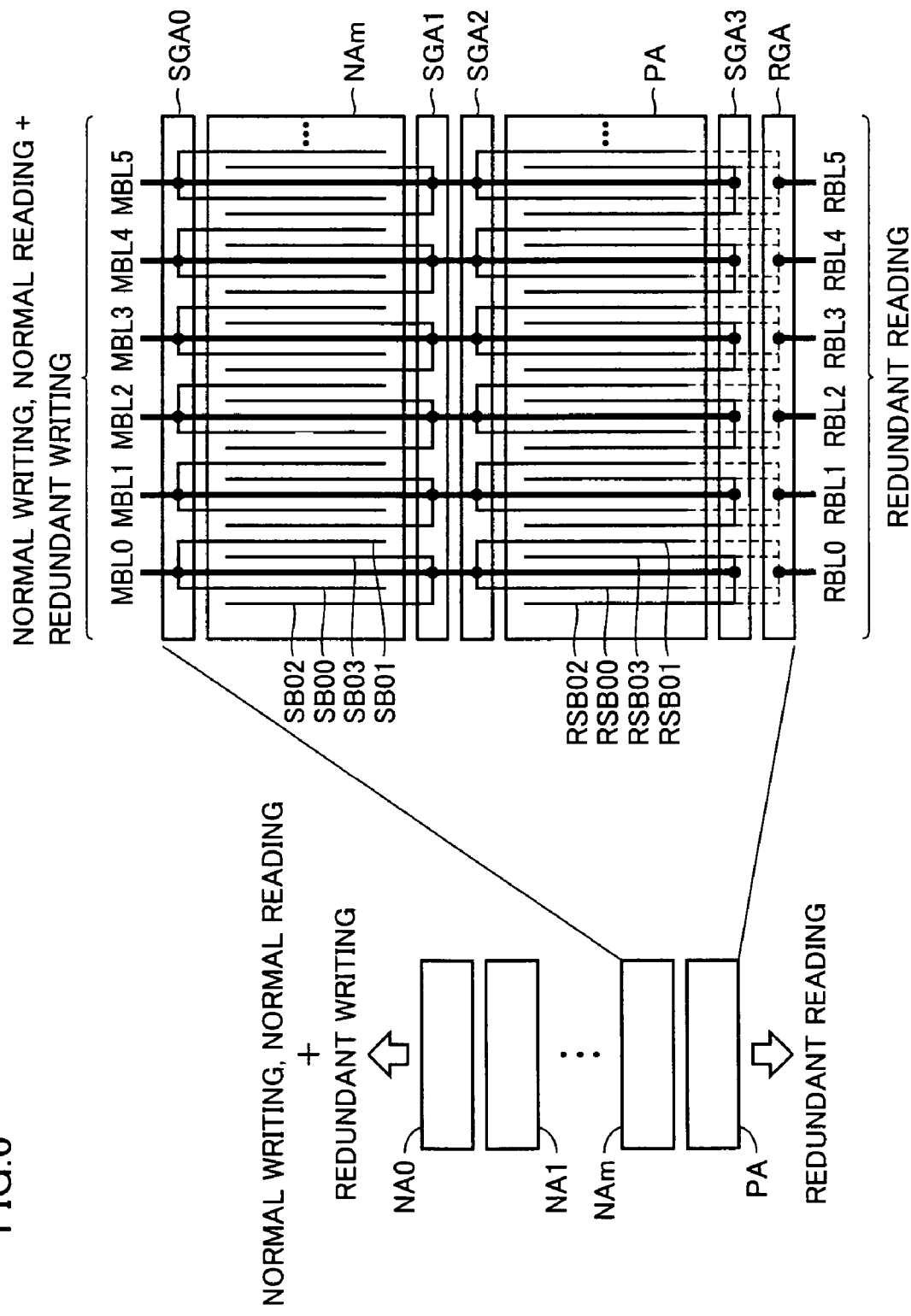
FIG. 6 is a diagram schematically illustrating an exemplary arrangement of the memory array in the nonvolatile semiconductor memory device according to the first embodiment of the present invention.

FIG. 6 is a diagram schematically illustrating an exemplary arrangement of the memory array in the nonvolatile semiconductor memory device according to the first embodiment of the present invention.

Referring to FIG. 6, PROM area PA is provided adjacent to the plurality of normal memory cell areas NA0 to NAm in the direction of the memory cell columns. In this arrangement, the data writing (normal writing) and the data reading (normal reading)for normal memory cell areas NA and the writing of redundant information (redundant writing) for PROM area PA are carried out by accessing memory cells MC and PROM cells PMC through main bit lines MBL. On the other hand, the reading of redundant information (redundant reading) for the PROM area is carried out by accessing PROM cells PMC through redundant bit lines RBL.

In the detail arrangement of PROM area PA and one normal memory cell area NAm adjacent thereto, there are provided main bit lines MBL which are extended across normal memory cell area NAm and PROM area PA as illustrated in FIG. 6. In normal memory cell area NAm, a plurality of sub bit lines SB00 to SB03 are arranged in correspondence with the respective memory cell columns and selectively connected to main bit lines MBL0 to MBL5, . . . at select gate areas SGA0 and SGA1 provided at the opposite ends.

In PROM area PA, PROM cells PMC for storing redundant information are arranged in a matrix shape (not shown). The structure and arrangement of the individual PROM cells PMC are the same as those of normal memory cell areas NA illustrated in FIG. 2, and therefore will not be described in detail. In correspondence with the respective PROM cell columns, a plurality of redundant sub bit lines RSB00 to RSB03, . . . are provided. Hereinafter, redundant sub bit lines RSB00 to RSB03, will be comprehensively represented by the character RSB.

Select gate areas SGA2 and SGA3 are provided at the opposite sides of PROM area PA in the direction of the memory cell columns. In select gate areas SGA2 and SGA3, select gates SG are provided between the respective redundant sub bit lines RSB and main bit lines MBL and selectively connect redundant sub bit lines RSB and main bit lines MBL. Thus, the data writing for PROM area PA is carried out by accessing PROM cells PMC through main bit lines MBL.

Here, for the data reading for PROM area PA, redundant bit lines RBL0 to RBL5 . . . are further arranged opposite to main bit lines MBL. Hereinafter, redundant bit lines RBL0 to RBL5 will be comprehensively represented by the character RBL.

With this structure, redundant sub bit lines RSB are selectively connected to redundant bit lines RBL through redundant select gates, not shown, for performing the data reading for PROM area PA. Hereinafter, the area in which the redundant select gates are arranged will be referred to as a redundant gate area RGA.

Redundant gate area RGA is placed adjacent to a select gate area SGA3 which controls the data writing for PROM area PA, as illustrated in FIG. 6. Therefore, as illustrated by the dotted line in FIG. 6, redundant sub bit lines RSB must be wired to extend beyond select gate area SGA3 to redundant gate area RGA.

However, it is physically difficult to electrically connect redundant sub bit lines RSB and redundant bit lines RBL in redundant gate area SGA. This is because select gate area SGA is already crowded with the optimized layout as illustrated in FIG. 5, making it difficult to wire all redundant sub bit lines RSB beyond this area to redundant gate area RGA.

Therefore, there will be suggested a structure which enables connection between redundant bit lines RBL and redundant sub bit lines RSB to realize reading of redundant information from PROM area PA.

Figure 7:
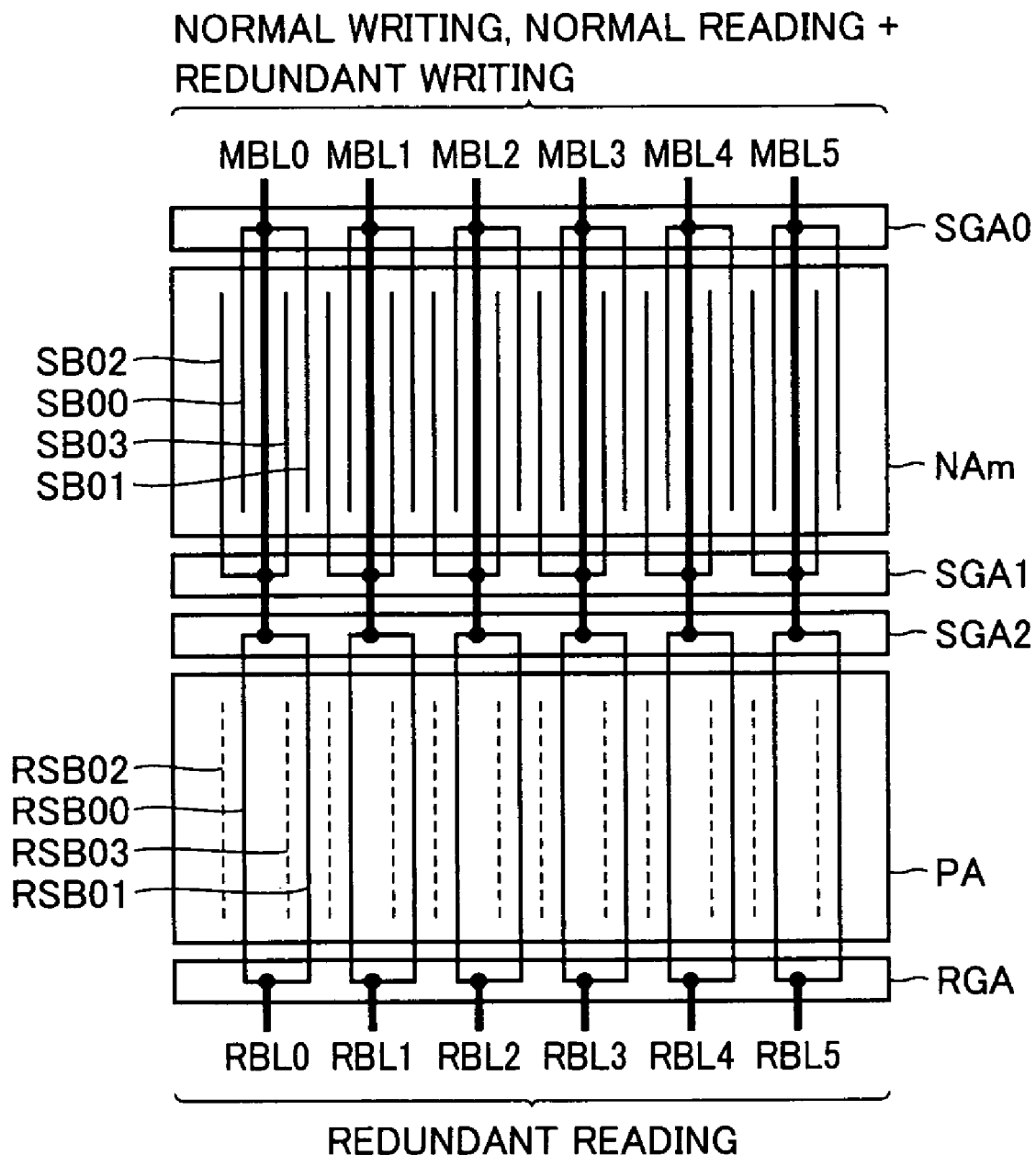
FIG. 7 is a diagram schematically illustrating an exemplary arrangement of the memory array in the nonvolatile semiconductor memory device according to the first embodiment of the present invention.

FIG. 7 is a diagram schematically illustrating an exemplary arrangement of the memory array in the nonvolatile semiconductor memory device according to the first embodiment of the present invention.

Referring to FIG. 7, in the structure of PROM area PA, select gate area SGA3 placed in a second direction, of the two select gate areas SGA2 and SGA3 illustrated in FIG. 6, is eliminated and only select gate area SGA2 placed in a first direction is placed. To cope with this, redundant gate area RGA is placed adjacent to PROM area PA.

With such a structure, the number of redundant sub bit lines RSB connected to a single main bit line MBL is reduced from 4 to 2. For example, the redundant sub bit lines connected to main bit line MBL0 are only RSB00 and RSB01.

Further, redundant sub bit lines RSB00 and RSB01 are connected to redundant bit line RBL0 in redundant gate area RGA. Namely, each of redundant sub bit lines RSB00 and RSB01 is connected at one end to main bit line MBL0 and connected at the other end to redundant bit line RBL0.

Therefore, for PROM area PA, the redundant writing may be carried out through main bit lines MBL and the redundant reading may be carried out by other paths through redundant bit lines RBL. Redundant sub bit lines RSB02 and RSB03 connected neither to main bit lines MBL nor to redundant bit lines RBL are so-called dummy sub bit lines and substantially do not function as bit lines.

Figure 8:
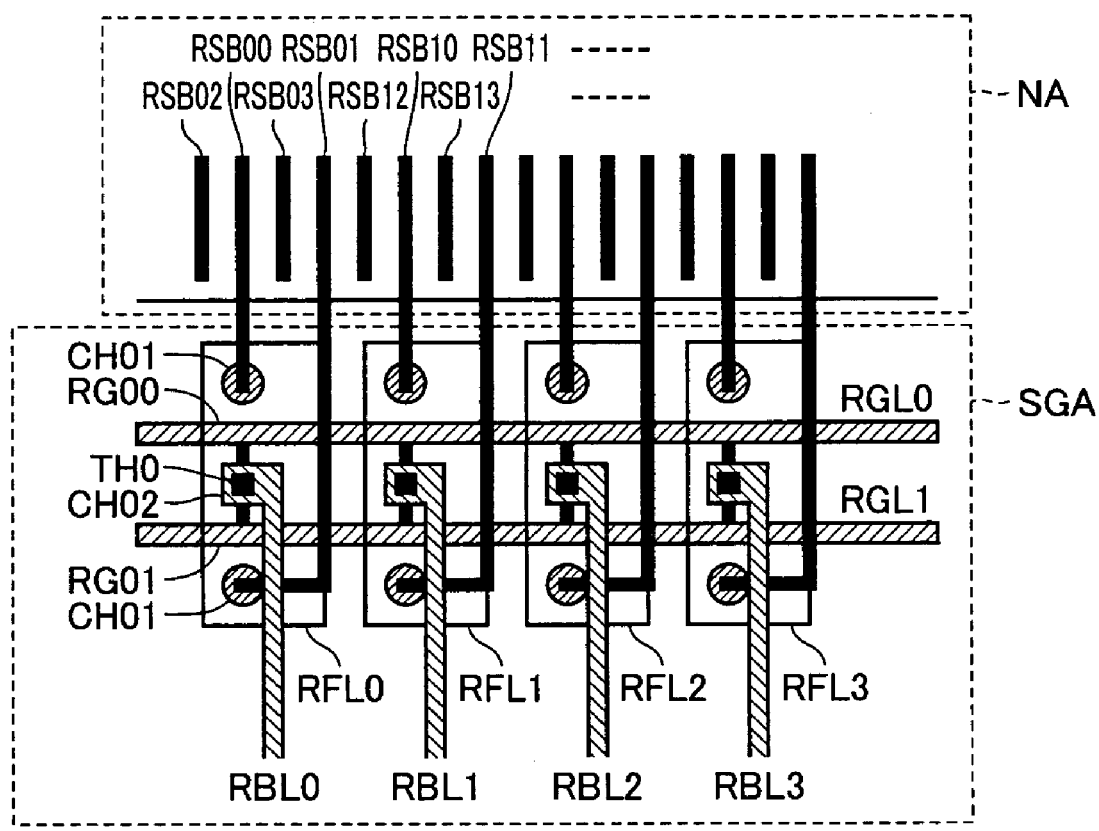
FIG. 8 is a diagram illustrating an exemplary layout of redundant gate area RGA illustrated in FIG. 7.

FIG. 8 is a diagram illustrating an exemplary layout of redundant gate area RGA illustrated in FIG. 7.

Referring to FIG. 8, in redundant gate area RGA, there are arranged redundant bit lines RBL0 to RBL3, . . . which are extended from-PROM area PA. Under redundant bit lines RBL0 to RBL3, . . ., activation areas RFL0 to RFL3 are respectively formed.

Redundant select gate selecting lines RGL0 and RGL1 are shared by a plurality of activation areas RFL.

In activation areas RFL, there are formed select gate transistors RG for electrically connecting redundant sub bit lines RSB and redundant bit lines RBL in response to select gate selecting lines RGL0, RGL1 being activated. For example, in activation area RFL0 illustrated in FIG. 8, there are formed select gate transistors RG00 and RG01 for electrically connecting redundant sub bit lines RSB00, RSB01 and redundant bit line RBL0.

Redundant select gate transistor RG00 is a MOS transistor and is connected at its gate to redundant select gate selecting line RGL0. Redundant select gate transistor RG00 is connected at its source to redundant sub bit line RSB00 provided at a lower metal layer, through a contact hole CH01, and is connected at its drain to redundant bit line RBL0 provided at an upper metal layer, through a contact hole CH02.

Similarly, redundant select gate transistor RG01 is connected at its gate to redundant select gate selecting line RGL1. Redundant select gate transistor RG01 is connected at its source of to redundant sub bit line RB01, through contact hole CH01, and is connected at its drain to redundant bit line RBL1, though a contact hole CH02.

With such a structure, there may be provided an advantage that the arrangement of select gate areas SGA having a fine layout configuration appropriate to normal memory cell areas NA may be applied, as such, to the redundant gate areas.

Further, according to this structure, half of redundant sub bit lines RSB arranged in PROM area PA are dummy sub bit-lines. Therefore, the PROM cells PMC connected to the dummy sub bit lines can not be used and thus the number of memory cells usable in PROM area PA is reduced to half However, under actual chip using conditions, the bit number per chip required as redundant information is an order of 1k bits while the number of the memory cells in PROM area PA reaches an order of from a few hundred K bits to 1M bits. Therefore, there is no disadvantage induced from the half-reduction of the number of usable memory cells. There is rather a larger advantage attributable to the continuously and commonality of the layout.

As described above, according to the first embodiment of the present invention, the data writing operation for the PROM area for storing redundant information is performed utilizing circuits for writing and erasing operations for normal memory cell areas. This may avoid complication and increase in the circuit size.

On the other hand, the reading of redundant information from the PROM area is performed utilizing paths separated from those for normal memory cell areas, enabling accurate reading operation and improving the efficiency of redundant relief.

Further, the redundant gate area and the select gate area may be structured with the same layout, which may further reduce the manufacturing cost.

Second Embodiment

In the first embodiment, there has been suggested a structure in which the reading of redundant information for PROM area PA is performed in paths separated from those for the reading for normal memory cell areas NA. Here, as previously described, the data reading operation for PROM area PA is performed at power-on. Therefore, stable reading operation is required, even though it is performed under unstable power supply voltage conditions.

In the present embodiment, there will be suggested a structure for stabilizing the reading operation for PROM area PA.

Generally, in the data reading operation for normal memory cell areas NA, as illustrated in FIG. 3, when the voltages of selected word lines WL have been raised to a predetermined internally-generated voltage VBOOST, the drain currents flowing through the memory cells MC to be read are read through the corresponding main bit lines MBL to determine whether the retained data is "0" or "1".

For example, in a NOR type flash memory, memory cells MC in the data-written state, or in the "0" data-retaining state, have a threshold voltage higher than that of memory cells MC in the data-erased state, or in the "1" data retaining state. Therefore, when internally-generated voltage VBOOST is applied to selected word lines WL, the memory cells MC in the data-written state generate a lower drain current. The current difference is detected to determine whether the retained data is "0" or "1" . Namely, assuming the current through the memory cells MC in the "0" data-retaining state is Ibst0, the current through the memory cells MC in the "1" data-retaining state is IbstI and a boundary cell current for determining whether the retained data is "0" or "0" is a trip current Idt, the relation Ibst0<Idt<Ibs1 must hold. Accordingly, in order to avoid mistaken data reading, the stability of internally-generated voltage VBOOST is extremely important.

However, internally-generated voltage VBOOST is a boosted voltage generated in reading/writing voltage generating circuit 20 in FIG. 1 based on the power supply voltage. Since just after power-on the power supply voltage has not been stabilized, the electrical potential level of internally-generated voltage VBOOST is accordingly unstable.

Here, there will be considered the case where the data "1" is read from PROM area PA just after power-on. It is assumed that just after power-on, the electrical potential at a selected program word line PWL has not been stabilized and has not been raised to a predetermined internally-generated voltage VBOOST level, being a voltage VL0W lower than internally-generated voltage VBOOST (VLOW<VBOOST). Accordingly, there will be generated a drain current Ilow flowing through the PROM cell PMC to be read that is lower than the estimated drain current Ibst1 for the "1" data-retaining state. If the drain current Ilow is equal to or lower than trip current Idt, the drain current determination circuit may mistakenly read the data in the PROM cell PMC to be read as "0" , not as "1".

In order to make a margin for preventing the drain current Ilow1 generated in the "1" data-retaining state from dropping below trip current Idt even when the electrical potential at selected program word line PWL is at a voltage VLOW lower than internally-generated voltage VBOOST, the erasing threshold voltage of PROM cells PMC is preset to a value lower than the erasing threshold voltage of memory cells MC. Hereinafter, there will be described a method for controlling the erasing threshold voltage of PROM cells PMC.

Figure 9:
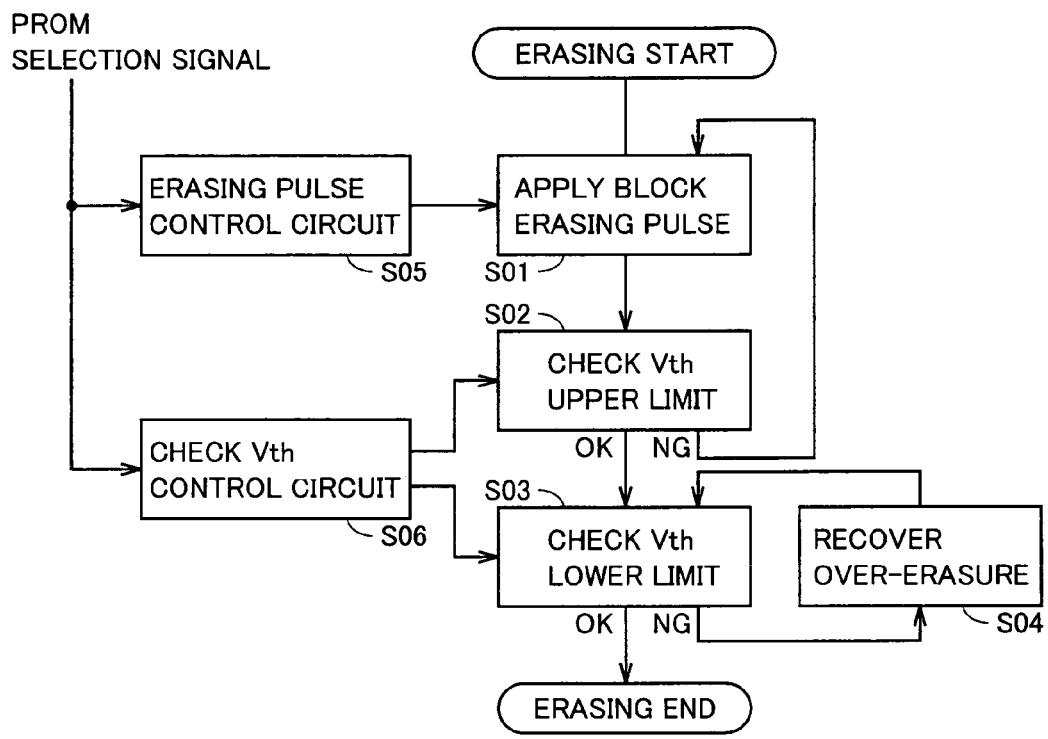
FIG. 9 is a flow chart illustrating an erasing sequence for the nonvolatile semiconductor memory device according to the second embodiment of the present invention.

FIG. 9 is a flow chart illustrating an erasing sequence for the nonvolatile semiconductor memory device according to the second embodiment of the present invention.

Referring to FIG. 9, the control of the erasing threshold voltage of PROM cells PMC is performed based on the erasing operation for normal memory cell areas NA.

At first, in the data erasing operation for normal memory cell areas NA, at the beginning of the erasing, an erasing pulse applying circuit (not shown) in reading/writing voltage generating circuit 20 applies erasing pulses with a predetermined pulse width to a block to be erased (step S01. In the case of a flush memory, a plurality of memory cells are collectively erased and this unit of erasing is referred to as a block. When erasing pulses are applied to the block to be erased, the threshold voltage is changed due to FN (Fowler-Nordheim) tunnel currents.

Then, the erasure verifying function for determining whether or not the retained information in the block has been erased is performed. The verifying circuit within verify/pulse control circuit 12 in FIG. 1 verifies that the threshold voltages of all the memory cells in the block to be erased are equal to or lower than an upper limit value (hereinafter, referred to as an erasing determination voltage) (step S02). If there exist threshold voltages higher than the upper limit value, the operation is returned to step S01 where erasing pulses are applied again. Until it is verified that all the memory cells have been erased, steps S01 and S02 are repeatedly performed. Once it is verified that all the memory cells have been erased, the operation proceeds to steps S03.

At step S03, the over erase verifying for verifying whether there are memory cells MC which have been over-erased is performed. Namely, after the aforementioned verifying circuit has completed the erase verifying, memory cells having a threshold voltage lower than a lower limit value (hereinafter, referred to as an over-erasure determination voltage) are detected. When over-erased memory cells are detected, over-erasure recovering is performed for each bit (step S04). The over-erasure recovering is a function for rewriting data using channel hot electrons for each bit, namely a function for raising the threshold voltage positively. After the over-erasure recovering, it is determined again whether or not there exist over-erased memory cells (step S03). If it is determined that there is no over-erased memory cell, the erasing operation ends.

Here, as the means for setting the erasing threshold voltage of PROM cells PMC to a value lower than the erasing threshold voltage of memory cells MC, the applying condition of erasing pulse (the applied voltage or the applying time) may be varied depending on whether the block to be erased is PROM cells PMC or memory cells MC by the erasing pulse control circuit in the verifying circuit (step S05).

More specifically, in the case where the block to be erased is PROM cells PMC, a PROM selecting signal is input to the erasing pulse controlling circuit. According to the PROM selecting signal, the erasing pulse controlling circuit sets the applying time of erasing pulses to a value larger than that for memory cells MC or sets the applied voltage of erasing pulses to a value larger than that for memory cells MC. Thus, the erasing threshold voltage of PROM cells PMC is set to a voltage lower than the erasing threshold voltage of memory cells MC.

Then, in the erasing verifying at steps S02 and S03, when the block to be erased is PROM cells PMC, the upper and lower limit values of the threshold voltage are set to values lower than those for memory cells MC. The control of the threshold voltage is performed in a check Vth control circuit according to the PROM selecting signal indicating that PROM cells PMC are to be erased, as illustrated in step S06.

Thus, the erasing threshold voltage of PROM cells PMC is set to a value lower than the erasing threshold voltage of memory cells MC. Accordingly, the electrical potentials at selected program word lines are voltages VLOW lower than internally-generated voltage VBOOST at power-on, a reading margin may be ensured, thereby avoiding mistaken reading.

Figure 10:
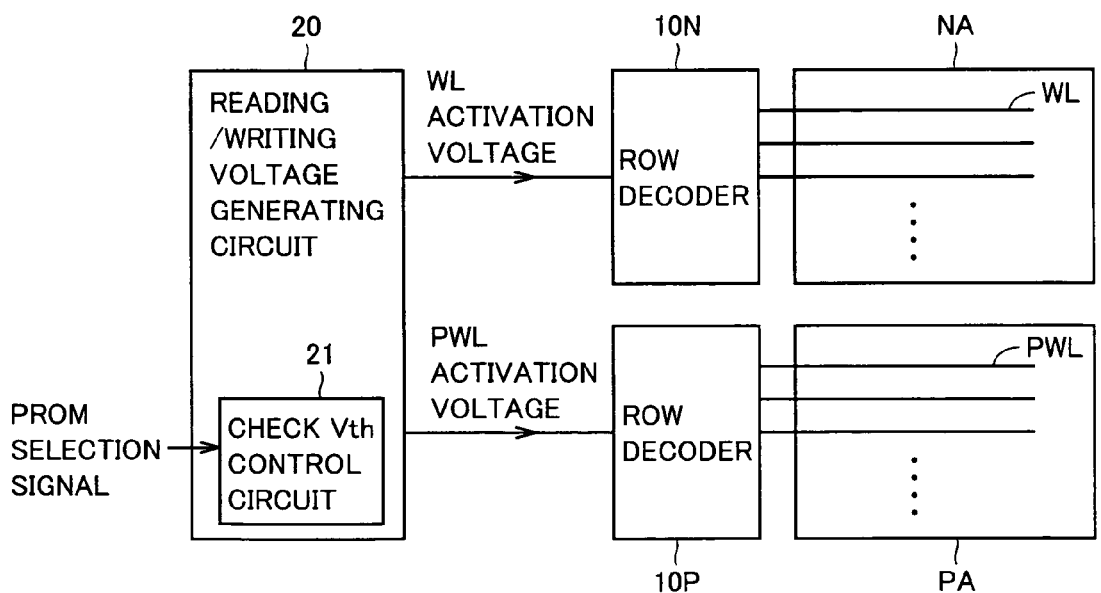
FIG. 10 is a schematic block diagram for describing the structure relating to the erasure verifying and over-erasure verifying in the erasing operation illustrated in FIG. 9.

FIG. 10 is a schematic block diagram for describing the structure relating to the erasure verifying and over-erasure verifying in the erasing operation illustrated in FIG. 9.

Referring to FIG. 10, the erasure verifying and over-erasure verifying are performed by generating the erasure determination voltage and the over-erasure determination voltage and supplying these determination voltages to selected word lines WL as WL activation voltages, in reading/writing voltage generating circuit 20.

Reading/writing voltage generating circuit 20 includes a check Vth control circuit 21 for adjusting the voltage levels of the WL activation voltages to be generated. In response to the PROM selecting signal, check Vth control circuit 21 adjusts the levels of the WL activation voltages. More specifically, when the PROM selecting signal is activated (this corresponds to the case where PROM cells PMC are to be erased), check Vth control circuit 21 adjusts the erasure determination voltage and the over-erasure determination voltage to values lower than determination voltages for the verifying operation for memory cells MC. The generated determination voltages are supplied as WL activation voltages to selected program word lines PWL through row decoder 10P.

In erasure verifying for PROM area PA, the erasure determination voltage is supplied through selected program word lines PWL to the gates of the PROM cells in the block to be erased and the source-drain currents are detected to determine whether or not the erasure has been performed.

In over-erasure verifying for PROM area PA, the over-erasure determination voltage is applied through selected program word lines PWL to the gates of the PROM cells in the block to be erased and it is determined whether or not source-drain currents are generated to detect over-erased PROM cells PMC.

As described above, according to the second embodiment of the present invention, the erasing threshold voltage of PROM cells PMC may be set to a value lower than the erasing threshold voltage of memory cells MC to ensure a reading margin, enabling accurate and stable reading of redundant information.

Third Embodiment

In the second embodiment, there has been described a structure for setting the erasing threshold voltage of PROM cells PMC to a value lower than the erasing threshold voltage of memory cells MC in order to ensure a reading margin.

However, since the lower limit value of the threshold voltage is set to a value lower than that for memory cells MC, PROM cells PMC in the data-erased stage ("1" data-retaining state) have a low threshold voltage and therefore may become depression-type transistors which generate a drain current even when the gate voltage is 0 V. Accordingly, even when the gate voltage of a PROM cell PMC is 0 V, namely when the PROM cell PMC is in the non-selected state, a leak current (hereinafter, referred to as an off current) may be generated in the PROM cell PMC.

In the data reading for PROM area PA, the voltage level of only a single selected program word line PWL of the plurality of program word lines PWL is changed to a lower voltage VLOW than internally-generated voltage VBOOST and the remaining, non-selected program word lines PWL are fixedly set to a ground voltage GND level.

Since a plurality of PROM cells PMC are connected to a single redundant sub bit line RSB as previously described, an increase in the off current per PROM cell PMC connected to the corresponding one of non-selected program word lines PWL leads to an increase in the total off current through redundant sub bit lines RSB. As an example, it will be now considered the case where the "0" data is read from a selected PROM cell PMC, assuming that the number of PROM cells PMC are connected to a single redundant sub bit line RSB is 128 and the off current per non-selected PROM cell PMC is Ioff. If correctively operated, the "0" data read current Ibst0 of the selected PROM cells PMC is lower than trip current Idt, and consequently the read data is determined to be "0". On the other hand, if the amount of the off current is increased, the current through the redundant sub bit line RSB becomes the sum of the "0" data read current Ibst0 and the total off current 127×Ioff through the 127 non-selected PROM cell PMC. Consequently, the current through the redundant sub bit line RSB becomes greater than trip current Idt. Consequently, the read information from the selected PROM cell PMC is mistakenly determined to be the data "1".

As described above, in the data reading for PROM area PA, there may be caused a new problem that ensuring a reading margin at power-on induces mistaken operation of read information. Therefore, in the present embodiment, there will be suggested a structure for avoiding mistaken data reading operation without impairing the data reading margin for PROM area PMC.

Figure 11:
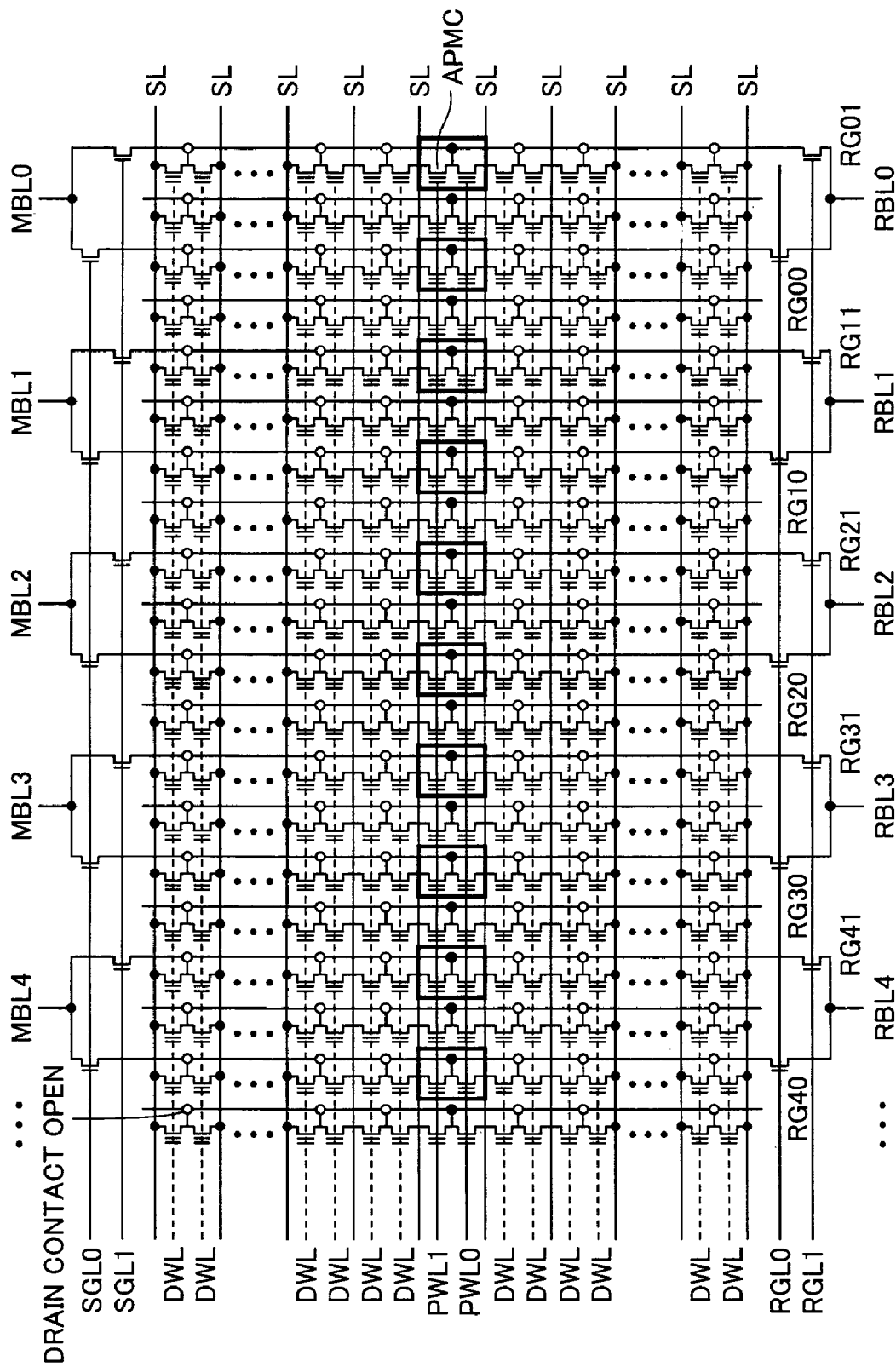
FIG. 11 is a circuit diagram illustrating the structure of PROM area PA in the nonvolatile semiconductor memory device according to the third embodiment of the present invention.

FIG. 11 is a circuit diagram illustrating the structure of PROM area PA in the nonvolatile semiconductor memory device according to the third embodiment of the present invention.

Referring to FIG. 11, PROM area PA includes a plurality of PROM cells PMC arranged in a matrix shape, redundant sub bit lines RSB00 to RSB03, . . . arranged in correspondence with the respective PROM cell columns, and source lines SL arranged in correspondence with the respective PROM cell rows. The basic structure of the PROM area PA is the same as that of normal memory cell areas NA illustrated in FIG. 2.

As previously described in the first embodiment, each of redundant sub bit lines RSB is connected at one end to the corresponding main bit line MBL and is connected at the other end to the corresponding redundant bit line RBL through the corresponding redundant select gate RSG. Further, half of redundant sub bit lines RSB are dummy sub bit lines and are not connected to any of the bit lines.

PROM area PA further includes two program word lines PWL0 and PWL1 arranged in correspondence with the respective PROM cell rows and a plurality of dummy word lines DWL arranged in correspondence with the other PROM cell rows.

Of the plurality of PROM cells, the PROM cells PMC connected at their gates to program word lines PWL0 and PWL1 are connected at their drains to the corresponding redundant sub bit lines RSB and thus are capable of retaining data. On the other hand, the PROM cells PMC connected at their gates to dummy word lines WL are not connected at their drain to the corresponding redundant sub bit lines RSB and thus their drain contacts are opened. Therefore, these PROM cells PMC are dummy cells which substantially do not function as memory cells. Namely, as illustrated in FIG. 11, in PROM area PA, the available PROM cells PMC are only the cells which are connected to program word lines PWL0 and PWL1 and redundant sub bit lines RSB which are connected to the corresponding main bit lines MBL and redundant bit lines RBL. Hereinafter, these available PROM cells are referred to as available PROM cells APMC.

In the data writing operation for PROM area PA having this structure, program word lines PWL0 and PWL1 are selected and a predetermined internally-generated voltage VPWL for data writing is applied to them. Thus, the control gates of available PROM cells APMC are set to internally-generated voltage VPWL. Further, the redundant sub bit lines RSB selected by select gate selecting lines SGL0 and SGL1 are set to a writing voltage VBLD and ground voltage GNP depending on the data to be written. Namely, the APROM cells connected to a single redundant sub bit line RSB are fed with internally-generated voltage VPWL and writing voltage VBLD or ground voltage GND, and therefore the same data is written into these APROM cells.

On the other hand, in the data reading operation for PROM area PA, program word lines PWL0 and PWL1 are concurrently set to internally-generated voltage VBOOST, or set to the same electrical potential by short-circuiting between program word lines PWL0 and PWL1. Here, program word lines PWL0 and PWL1 are set to a voltage VLOW lower than internally-generated voltage VBOOST at power-on, and as described in the second embodiment the threshold voltage for APROM cells APMC may be set to a low value for making a reading margin.

Further, a predetermined reading voltage VBLP is applied to the redundant sub bit lines RSB selected by redundant gate selecting lines RGL0 and RGL1. Consequently, out of the APROM cells APMC connected to program word lines PWL0 and PWL1, the same retained data is concurrently read through the redundant sub bit lines RSB. Here, since the plurality of dummy cells other than the APROM cells APMC are not connected to the selected redundant sub bit line RSB, the off current is not generated and only the read current flows, thereby preventing mistaken operation due to increases in the off current.

Further, by employing the aforementioned structure, the amount of redundant data that a single redundant sub bit line RSB can retain is reduced to 1 bit. However, the bit number per chip required as redundant information is an order of 1 K bits, and therefore even if a number of sub bit lines commensurate with that order are reserved in PROM area PA, there is still a sufficient advantage in the circuit structure. Further, while in the present embodiment, one bit of redundant information is stored in the two APROM cells APMC connected to a pair of program word lines PWL0 and PWL1, an equivalent effect may be obtained even by a structure in which one bit of redundant information is stored in a single APROM cell APMC connected to a single program word line.

As described above, according to the third embodiment of the present invention, in the reading of redundant information for the PROM area, it is possible to ensure a reading margin and prevent mistaken operation due to off currents, enabling accurate and stable reading of redundant information.

Fourth Embodiment

Figure 12:
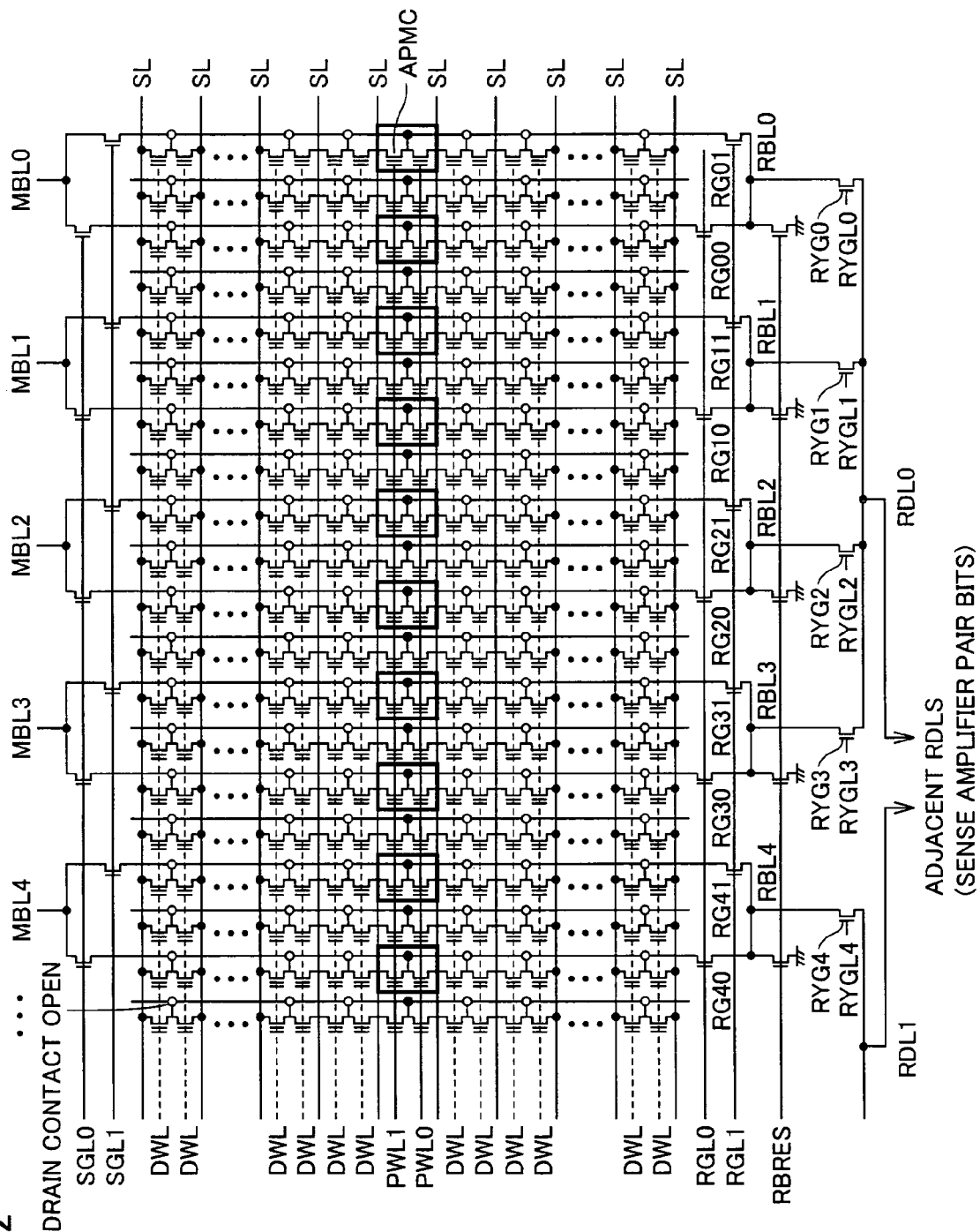
FIG. 12 is a circuit diagram illustrating the structure of PROM area PA in the nonvolatile semiconductor memory device according to the fourth embodiment of the present invention.

FIG. 12 is a circuit diagram illustrating the structure of PROM area PA in the nonvolatile semiconductor memory device according to the fourth embodiment of the present invention. In the present embodiment, there will be suggested a structure which further improves the reading margin over the third embodiment.

Referring to FIG. 12, PROM area PA includes a plurality of PROM cells PMC arranged in a matrix shape, redundant sub bit lines RSB00 to RSB03, . . . arranged in correspondence with the respective PROM cell columns, and source lines SL arranged in correspondence with the respective PROM cell rows. Similarly to the third embodiment, the basic arrangement of the PROM area PA is the same as that of normal memory cell areas NA illustrated in FIG. 2.

Each of redundant sub bit lines RSB is connected at one end to the corresponding main bit line MBL and is connected at the other end to the corresponding redundant bit line RBL through the corresponding redundant select gate RSG. For example, redundant sub bit lines RSB00 and RSB01 are connected to main bit lines MBL0 through select gates SG00 and SG01 and also connected to redundant bit line RBL0 through redundant select gates RG00 and RG01, respectively. Further, half of redundant sub bit lines RSB (for example, RSB02 and RSB03) are dummy sub bit lines and are not connected to any of the bit lines.

Redundant bit lines RBL0 to RBL3 are connected to redundant data line RDL0 through redundant Y gates RYG0 to RYG3 provided in correspondence with the memory cell columns. Redundant bit lines RBL4 to RBL7, not shown, are also connected to redundant data line RDL1 through four redundant gates RYG 4 to RYG 7 provided in correspondence with the memory cell columns. Hereinafter, redundant Y gates RYG0 to RYG4, . . . will be comprehensively represented by the character RYG.

Redundant Y gates RYG0 to RYG3 selectively turn on in response to the corresponding ones of redundant gate lines RYGL0 to RYGL3 being activated. Redundant gate lines RYGL0 to RYGL3 are selectively activated according to the results of column selections. Consequently, one fourth of redundant bit lines RBL0 to RBL3 is selected and electrically connected to redundant data line RDL0.

Similarly, redundant Y gates RYG4 to RYG7 selectively turn on in response to the corresponding ones of redundant gate lines RYGL4 to RYGL7 being activated. Consequently, one fourth of redundant bit lines RBL4 to RBL7 is selected and electrically connected to redundant data line RDL1.

As previously described, four redundant bit lines RBL are decoded through redundant Y gates RYG, and therefore redundant information transferred to a PROM sense amplifier PROM-SA, not shown, may be reduced to one fourth and may be read sequentially. Further, as compared with a structure in which a plurality of redundant bit lines RBL are each connected to a sense amplifier, the circuit structure of the sense amplifier may be simplified. Further, while in the present embodiment, there has been described a structure in which redundant bit lines RBL are decoded into one fourth, the present invention is applicable to larger units of decoding.

PROM area PA further includes two program word lines PWL0 and PWL1 arranged in correspondence with respective PROM cell rows and a plurality of dummy word lines DWL arranged in correspondence with the respective other PROM cell rows. Similarly to the third embodiment, of the plurality of PROM cells, the PROM cells APMC connected at their gates to program word lines PWL0 and PWL1 are connected at their drains to the corresponding redundant sub bit lines RSB and are thus capable of retaining data. On the other hand, the PROM cells connected at their gates to dummy word lines WL are opened at their drain contacts and thus are dummy cells.

For PROM area PA having this structure, the data reading operation is carried out by complementarily connecting adjacent redundant data lines (redundant data lines RDL0 and RDL1 in FIG. 11) and detecting the read current difference between complementary redundant data lines. More specifically, the data "0" has been written into all the PROM cells APMC connected to the redundant sub bit lines RSB00, RSB01, . . . which are selectively connected to redundant data line RDL0, while the data "1" has been written into all the PROM cells APMC connected to the redundant sub bit lines RSB40, RSB41, . . . which are selectively connected to redundant data line RDL1.

In data reading, one fourth of redundant bit lines RBL selected by redundant gates RYG are electrically connected with redundant data lines RDL0 and RDL1. Thus, the read current of the PROM cells APROM retaining the data "0" and the read current of the PROM cells APROM retaining the data "1" flow respectively through complimentary redundant data lines RDL0 and RDL1.

Further, in PROM sense amplifier PROM-SA, the current difference between complimentary redundant data lines RDL0, RDL1 are detected to determine the polarity of the read information.

By determining whether the read data is "0" or "1" using complimentary redundant data lines RDL0 and RDL1, it is unnecessary to set trip current Idt, which would otherwise been necessary as a reference current level, in the data reading for normal memory cell areas NA.

Furthermore, even when the electrical potential of internally-generated voltage VBOOST applied to program word lines PWL is low at power-on and the absolute amounts of the read currents through PROM cells APROM are small, the reading margin may be further improved enabling accurate data reading, since the data is determined from the read current difference between the complimentary data pieces.

As described above, according to the fourth embodiment, in the reading of redundant information, a plurality of redundant bit lines are decoded through a single redundant data line and therefore information transmitted to the PROM sense amplifier may be reduced and may be read out sequentially. Furthermore, the structure of the PROM sense amplifier may be simplified, thereby suppressing increases in the cost associated with the redundant structure.

Further, since adjacent data lines are complimentarily connected to the PROM sense amplifier and the data is determined from the read current difference between complementary data lines, accurate redundant information reading may be realized even when the absolute values of respective read currents are small.

Fifth Embodiment

In the present embodiment, there will be described an exemplary structure of the PROM sense amplifier PROM-SA for performing the redundant information reading using the complementary redundant data lines described in the fourth embodiment.

Figure 13:
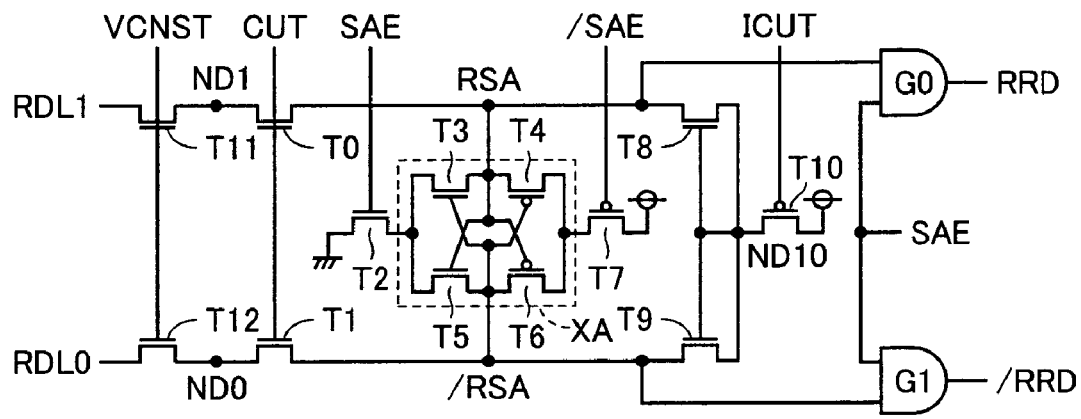
FIG. 13 is a circuit diagram illustrating the structure of PROM sense amplifier PROM-SA in the nonvolatile semiconductor memory device according to the fifth embodiment of the present invention.

FIG. 13 is a circuit diagram illustrating the structure of PROM sense amplifier PROM-SA in the nonvolatile semiconductor memory device according to the fifth embodiment of the present invention.

Referring to FIG. 13, PROM sense amplifier PROM-SA includes N-channel MOS transistors T11 and T12 which connects complimentary redundant data lines RDL1 and RDL2 to nodes ND1 and ND2, respectively, in response to a sub bit line limit voltage VCNST being applied to selected program word lines PWL. Further, PROM sense amplifier PROM-SA includes N-channel MOS transistors T0 and T1 which connects nodes ND1 and ND2 to sense amplifier nodes RSA, /RSA respectively in response to a sense amplifier confining signal CUT, a cross-couple type amplifier XA which, when activated, differentially amplifies signals at sense amplifier complimentary nodes RSA, /RSA, a P-channel MOS transistor T7 which supplies the power supply voltage to cross-couple type amplifier XA when a sense amplifier activation signal /SAE is activated, and an N-channel MOS transistor T2 which supplies the ground voltage to cross-couple type amplifier XA when a sense amplifier activation signal SAE is activated.

More specifically, cross-couple type amplifier XA includes P-channel MOS transistors T4 and T5 cross-connected to each other and N-channel MOS transistors T3 and T5 cross-connected to each other.

P-channel MOS transistor T7 conducts to supply the power supply voltage to the common source node of P-channel MOS transistors T4 and T6, when sense amplifier activation signal /SAE is activated ("L" level). N-channel MOS transistor T2 conducts to supply the ground voltage to the common source node of N-channel MOS transistors T3 and T5 when sense amplifier activation signal SAE is activated ("H" level). Therefore, cross-couple type amplifier XA is activated when sense amplifier activation signals /SAE, SAE are activated to differentially amplify signals at sense amplifier complimentary nodes RSA, /RSA.

PROM sense amplifier PROM-SA further includes a P-channel MOS transistor T10 which connects a power supply node with a node ND10 in response to an current cut signal ICUT, and source follower transistors T8, T9 connected between node ND10 and sense amplifier complimentary nodes RSA, /RSA respectively.

As will be described later, sense amplifier confining signal CUT is a signal for confining electric charge at sense amplifier complimentary nodes RSA, /RSA. Sense amplifier confining signal CUT is activated ("H" level) in response to a signal commanding reading and is inactivated ("L" level) in response to sense amplifier activation signal SAE being activated.

Current cut signal ICUT is a signal for driving the read current flowing through complimentary redundant data lines RDL1 and RDL0 into the sense amplifier. Current cut signal ICUT is in the inactivated state ("L" level) for driving the read current when sense amplifier activation signal SAE is inactivated, and is activated ("H" level) in response to sense amplifier activation signal SAE being activated.

PROM sense amplifier PROM-SA further includes an AND gate GO which receives signals at sense amplifier complimentary node RSA and sense amplifier activation signal SAE and generates read data RDD as the operation result of the logical multiplication and an AND gate G1 which receives signals at sense amplifier complimentary node /RSA and sense amplifier activation signal SAE and generates read data /RDD as the operation result of the logical multiplication.

Figure 14:
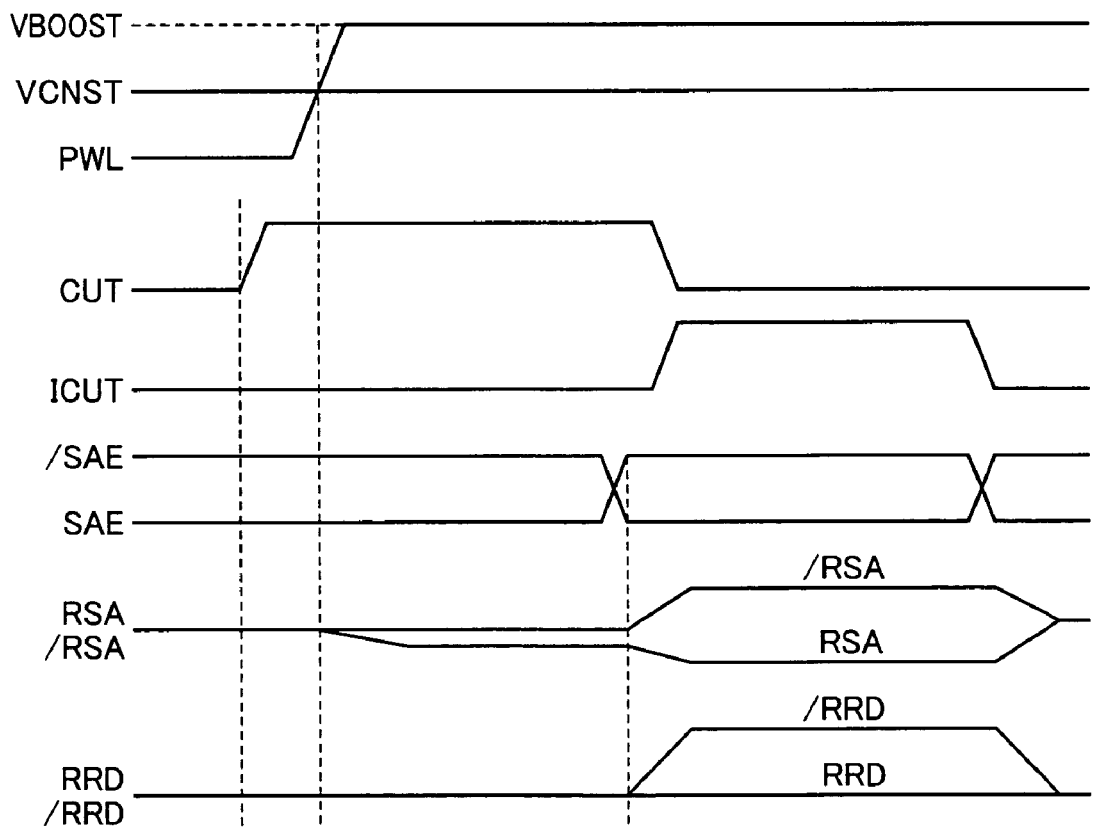
FIG. 14 is an operating waveform diagram for describing the data reading operation using PROM sense amplifier PROM-SA illustrated in FIG. 13.

FIG. 14 is an operating waveform diagram for describing the data reading operation using PROM sense amplifier PROM-SA illustrated in FIG. 13.

Referring to FIG. 14, in the data reading, sense amplifier confining signal CUT rises to "H" level and accordingly N-channel MOS transistors T0, T1 conduct to electrically connect nodes ND0, ND1 with sense amplifier complimentary nodes RSA, /RSA, respectively.

Then, when the electrical potential at selected program word lines PWL rises to the sub bit line limit voltage VCNST level which is a fixed voltage, N-channel MOS transistors T11 and T12 conduct to electrically connect complimentary redundant nodes RDL1, RDL0 with nodes ND0, ND1, respectively. Accordingly, complimentary redundant nodes RDL1, RDL0 and sense amplifier complimentary nodes RSA, /RSA are connected, respectively.

Then, P-channel MOS transistor T10 conducts to electrically connect the power supply node with node ND 10 when current cut signal ICUT is inactivated ("L" level). Source follower transistors T8, T9 have the same transistor size and are connected at their gates and drains to node ND10 and at their sources to sense amplifier complimentary nodes RSA, /RSA, respectively.

Source follower transistors T8, T9 conduct in response to the power supply voltage being applied to node ND10 and drive the read currents corresponding to the retained data in the APROM cells (not shown) connected to complimentary redundant data lines RDL1, RDL0. More specifically, in the case where the APROM cells connected to complimentary redundant data line RDL1 is in the data-erased state (the "1" data retaining state) and the APROM cells connected to complimentary redundant data line RDL0 is in the data-written state (the "0" data retaining state), read current Ibst1 of the data "1" flows through source follower transistor T8 and read current Ibst0 of the data "0" flows through source follower transistor T9. As previously described, there is the relation Ibst1>Ibst0 between read current Ibst1 of the data "1" and read current Ibst0 of the data "0". Since source follower transistors T8, T9 have the same size, a voltage difference corresponding to the read current difference will be generated between the respective sources. Namely, source follower transistors T8, T9 convert the read current difference into a voltage difference, which leads to a voltage difference between sense amplifier complimentary nodes RSA, /RSA.

Then, in response to sense amplifier complimentary signals SAE, /SAE being activated, sense amplifier confining signal CUT is activated to "L" level and also current cut signal ICUT is activated to "H" level. Consequently, N-channel MOS transistors T0, T1 and source follower transistors T8, T9 are brought into the non-conducted states. Consequently, sense amplifier complimentary nodes RSA, /RSA are electrically separated from complimentary redundant data lines RDL1, RDL0 and the power supply node. Thus, electric charge is confined at sense amplifier complimentary nodes RSA, /RSA.

Then, cross-couple type amplifier XA is activated in response to sense amplifier complimentary signals SAE, /SAE to differentially amplify the signals at sense amplifier complimentary nodes RSA, /RSA.

Finally, AND circuits G0, G1 generate "H" level read data /RDD and "L" level read data RDD according to the signals at sense amplifier complimentary nodes RSA, /RSA and sense amplifier activation signal SAE activated to "H" level.

PROM sense amplifier PROM-SA may be realized by the following exemplary modified structure, as well as by the structure illustrated in FIG. 13, to achieve equivalent effects.

Figure 15:
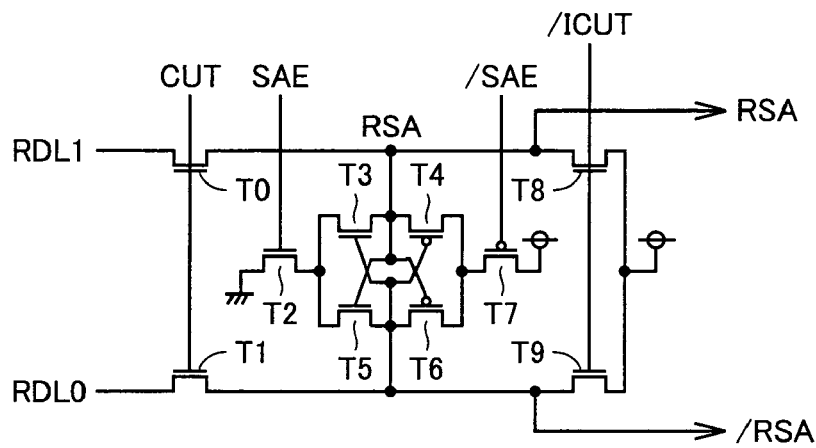
FIG. 15 is a circuit diagram illustrating the exemplary modified structure of PROM sense amplifier PROM-SA in the nonvolatile semiconductor memory device according to the fifth embodiment of the present invention.

FIG. 15 is a circuit diagram illustrating the exemplary modified structure of PROM sense amplifier PROM-SA in the nonvolatile semiconductor memory device according to the fifth embodiment of the present invention.

Referring to FIG. 15, PROM sense amplifier PROM-SA includes N-channel MOS transistors T0, T1 which connects complimentary redundant data lines RDL0, RDL1 with sense amplifier complimentary nodes RSA, /RSA, respectively, in response to sense amplifier confining signals CUT, a cross-couple type amplifier XA which, when activated, differentially amplifies signals at sense amplifier complimentary nodes RSA, /RSA, a P-channel MOS transistor T7 which supplies the power supply voltage to cross-couple type amplifier XA when sense amplifier activation signal /SAE is activated, and an N-channel MOS transistor T2 which supplies the ground voltage to cross-couple type amplifier XA when sense amplifier activation signal SAE is activated.

PROM sense amplifier PROM-SA further includes source follower transistors T8, T9 which connect the power supply node with sense amplifier complimentary nodes RSA, /RSA, in response to a current cut signal /ICUT.

PROM sense amplifier PROM-SA of FIG. 15 basically has the same structure as that of FIG. 13 except that source follower transistors T8 and T9 are driven by current cut signals /ICUT and N-channel MOS transistors T11, T12 are eliminated. Therefore, detailed description of the same components as those in FIG. 13 will not be repeated. Further, sense amplifier confining signal CUT and current cut signal /ICUT are the same signal as that of FIG. 13 and the reversed signal of that of FIG. 13 respectively, and therefore detailed description of these signals will be omitted.

Figure 16:
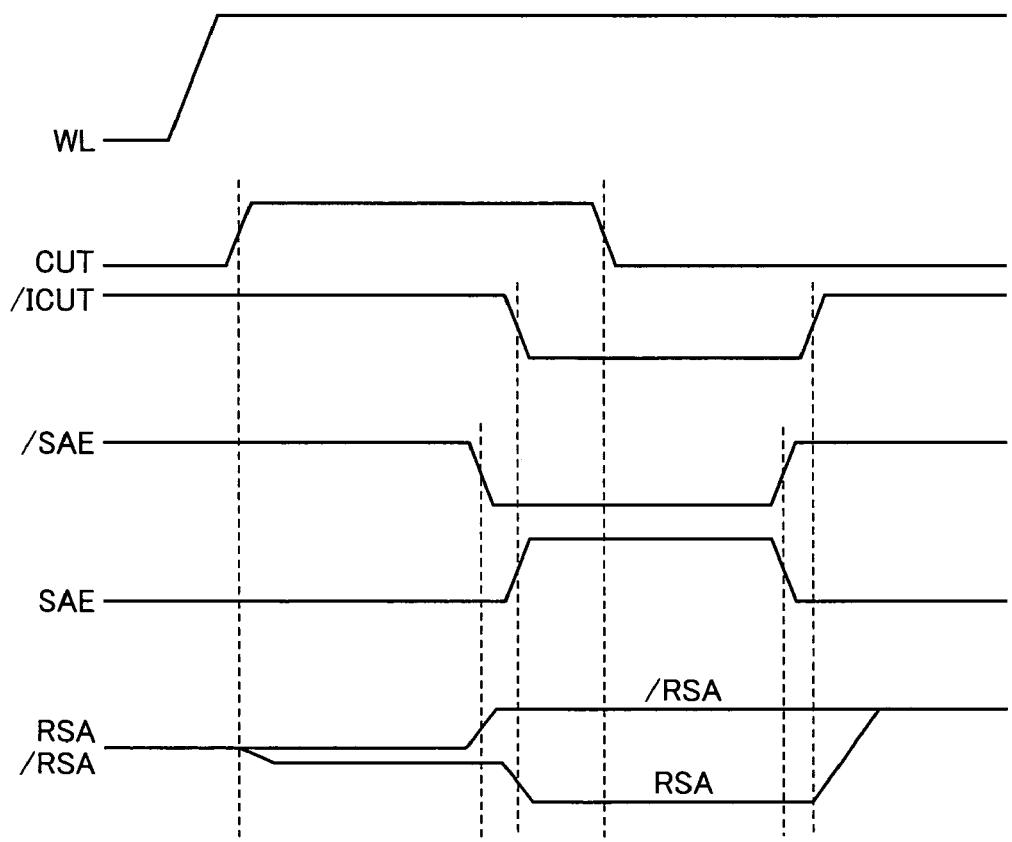
FIG. 16 is an operating waveform diagram for describing the data reading operation using PROM sense amplifier PROM-SA illustrated in FIG. 15.

FIG. 16 is an operating waveform diagram for describing the data reading operation using PROM sense amplifier PROM-SA illustrated in FIG. 15.

Referring to FIG. 16, in data reading, sense amplifier confining signal CUT rises to "H" level and accordingly N-channel MOS transistors T0, T1 conduct to electrically connect redundant data nodes RND0, RND1 with sense amplifier complimentary nodes RSA, /RSA, respectively.

Then, source follower transistors T8, T9 conduct when current cut signal/ICUT is activated ("H" level) to electrically connect the power supply node and sense amplifier complimentary nodes RSA, /RSA, respectively. Source follower transistors T8, T9 drive the read current corresponding to the retained data in the APROM cells (not shown) connected to complimentary redundant data lines RDL1, RDL0. Source follower transistors T8, T9 have the same size, and there will be generated, between the respective sources, a voltage difference corresponding to the read current difference. Namely, similarly to FIG. 13, source follower transistors T8, T9 convert the read current difference into a voltage difference, which leads to the voltage difference between sense amplifier complimentary nodes RSA, /RSA.

Then, in response to sense amplifier complimentary signals SAE, /SAE, sense amplifier confining signal CUT is activated to "L" level and also current cut signal ICUT is activated to "H" level. Accordingly, N-channel MOS transistors T0, T1 and source follower transistors T8, T9 are brought into the non-conducted states. Consequently, sense amplifier complimentary nodes RSA, /RSA are electrically separated from complimentary redundant data lines RDL1, RDL0 and the power supply node. Therefore, electric charge is confined at sense amplifier complimentary nodes RSA, /RSA.

Then, cross-couple type amplifier XA is activated in response to sense amplifier complimentary nodes RSA, /RSA being activated to differentially amplify the signals at sense amplifier complimentary nodes RSA, /RSA. The differentially-amplified signals at sense amplifier complimentary nodes RSA, /RSA are output as read data.

As described above, according to the fifth embodiment of the present invention, there is provided a structure in which the current difference between the complimentary redundant data lines is converted into a voltage difference and the voltage difference is differentially amplified in the PROM sense amplifier to determine the read data, and therefore the read margin may be further improved to stabilize the data reading.

Sixth Embodiment

In the aforementioned embodiments, there have been described structures which ensure a sufficient reading margin to accurately read the redundant information retained in PROM area PA. In the aforementioned structures, the data reading for PROM area PA is performed at power-on based on internally-generated voltage VBOOST applied to selected program word lines, and therefore it is important to stabilize internally-generated voltage VBOOST.

Therefore, in the present embodiment, there will be suggested detecting, at power-on, internally-generated voltage VBOOST reaching a voltage level which enables driving selected program word lines to the activated state and then performing the reading operation to ensure further stabilized reading operation. The present embodiment is applicable to the nonvolatile semiconductor memory devices according to the aforementioned first, third and fourth embodiments.

Figure 17:
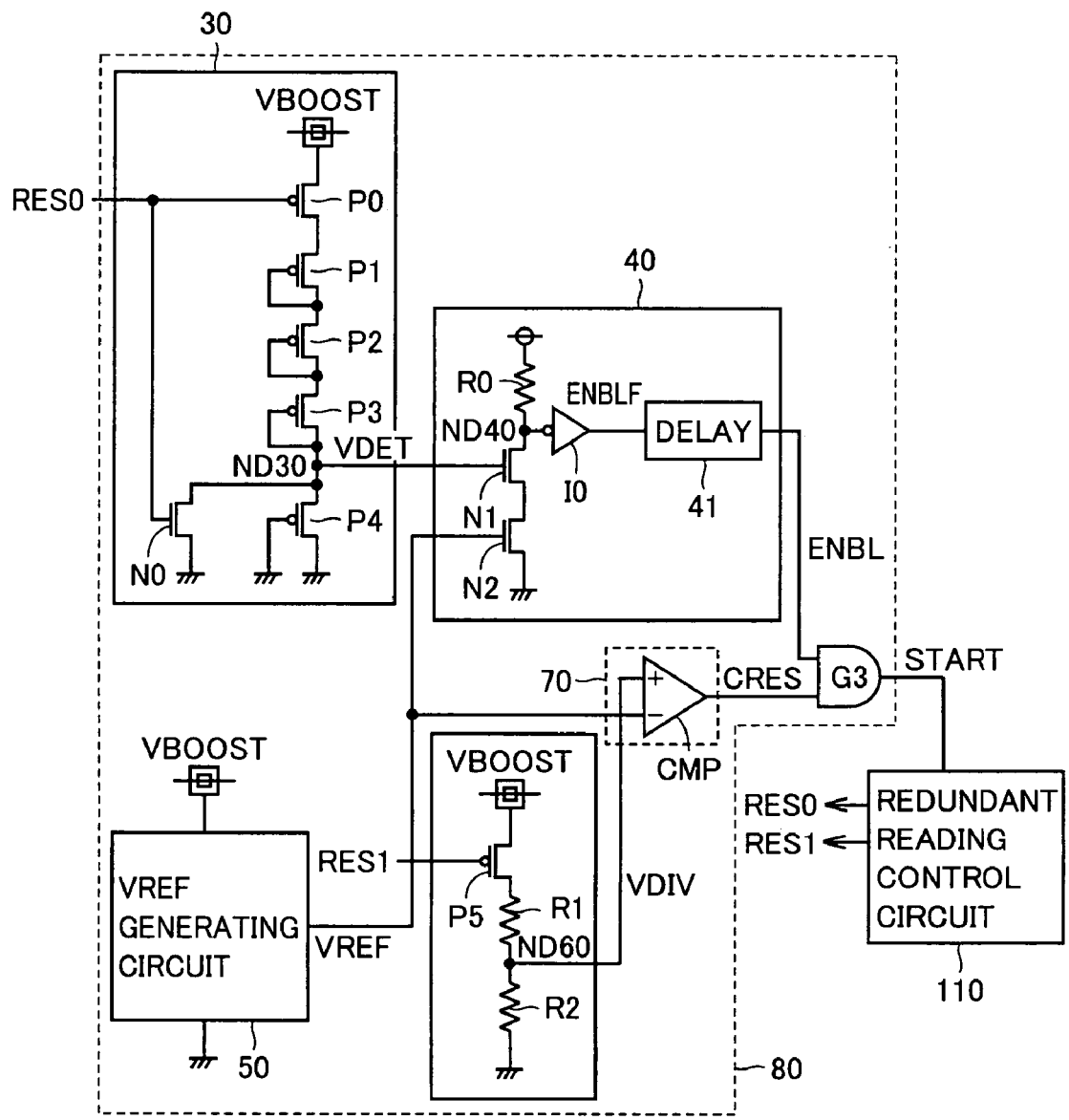
FIG. 17 is a circuit diagram illustrating the structure of an internal power supply detection circuit provided in the nonvolatile semiconductor memory device according to the sixth embodiment of the present invention.

FIG. 17 is a circuit diagram illustrating the structure of an internal power supply detection circuit provided in the nonvolatile semiconductor memory device according to the sixth embodiment of the present invention.

Referring to FIG. 17, an internal power supply detection circuit 80 includes a VBOOST brief detection circuit 30 for approximately detecting the electric potential of internally-generated voltage VBOOST, a VREF generating circuit 50 for generating a reference voltage VREF which is a detection reference, a brief enable circuit 40 for outputting an enable signal according to the detection result of VBOOST brief detection circuit 30 and reference signal VREF, a VBOOST voltage division circuit 60 for dividing internally-generated voltage VBOOST, a VBOOST detail detection circuit 70 for detailedly detecting the electrical potential of internally-generated voltage VBOOST based on the divided voltage of internally-generated voltage VBOOST, and an AND circuit G3 which generates a final detection result from the brief detection result and the detail detection result.

The detection result output from AND circuit G3 is input to a redundant reading control circuit 110 as a reading starting signal START indicating that internally-generated voltage VBOOST reaches a predetermined voltage level enabling the data reading operation.

Redundant reading control circuit 1-10 performs the redundant information reading operation for PROM area PA, in response to reading starting signal START being activated. Here, redundant reading control circuit 110 generates reset signals RES0, RES1 for initializing reading starting signal START, in response to the reading of redundant information being started. Reset signals RES0, RES1 are in the inactivated state ("L" level) before the reading operation of redundant information is started and are activated ("H" level) in response to the reading operation being started. Although there may be some degree of delay between the timings of reset signals RES0, RES1 because of the design, signals RES0, RES1 are substantially the same signal.

VBOOST brief detection circuit 20 is a section for approximately detecting that internally-generated voltage VBOOST reaches a predetermined voltage level and includes P-channel MOS transistors P0 to P4 connected in series between internally-generated voltage VBOOST and the ground voltage.

P-channel MOS transistor P0 is connected at its gate to redundant reading control circuit 110 and at its source to a supply node of internally-generated voltage VBOOST. The drain of P-channel MOS transistor P0 is connected to the source of P-channel MOS transistor P1. P-channel MOS transistor P0 turns on in response to reset signal RES0 being inactivated to "L" level to electrically connect the supplying node of internally-generated voltage VBOOST and P-channel MOS transistor P0.

P-channel MOS transistors P1 to P3 are diode-connected between P-channel MOS transistor P0 and P-channel MOS transistor P4.

P-channel MOS transistor P4 is connected at its gate and drain to the ground voltage to form a load resistance.

An N-channel MOS transistor No is connected between the connection node ND 30 of P-channel MOS transistors P3, P4 and the ground potential. N-channel MOS transistor N0 turns on in response to reset signal RES0 being activated ("H" level) to electrically connect connection node ND03 and the ground potential.

In the above structure, P-channel MOS transistor P0 and N-channel MOS transistor N0 complimentarily turn on according to reset signal RES0.

When reset signal RES0 is inactivated to "L" level, P-channel MOS transistor P0 turns on and internally-generated voltage VBOOST is consequently applied to P-channel MOS transistors P1 to P3. Once internally-generated voltage VBOOST has been raised to a voltage equal to or higher than the sum of the threshold voltages of P-channel MOS transistors P1 to P3 (3×Vthp, in the case these threshold voltages are all Vthp), P-channel MOS transistors P1 to P3 turn on, driving an electric current into P-channel MOS transistor P4, which is a load resistance. Consequently, the electrical potential at connection node ND30 is raised to "H" level, which is supplied as a detection signal VDET to brief enable circuit 40 which is the subsequent stage. Namely, VBOOST brief detection circuit 30 detects that internally-generated voltage VBOOST reaches a predetermined voltage level and generates an "H" level detection signal VDET.

On the other hand, when reset signal RES0 is activated to "H" level, N-channel MOS transistor N0 turns on to electrically connect connection node ND30 and the ground voltage. Consequently, an "L" level detection signal VDET is supplied to brief enable circuit 40.

VREF generating circuit 50 is a section for generating reference voltage VREF based on internally-generated voltage VBOOST. Reference voltage VREF corresponds to a divided voltage of the activation voltage which drives selected program word lines PWL to the activated state. The generated reference voltage VREF is supplied to brief enable circuit 40 and VBOOST detail detection circuit 60.

Brief enable circuit 40 includes a resistance R0 and N-channel MOS transistors N1, N2 connected in series between the power supply voltage VCC and the ground voltage, an inverter 10 and a delay circuit 41.

N-channel MOS transistor N1 is connected at its gate to the output node of VBOOST brief detection circuit 30 and turns on in response to a "H" level detection signal VDET. N-channel MOS transistor N2 is connected at its gate to the output node of VREF generating circuit 50 and turns on in response to a high-potential ("H" level) reference signal VREF. Namely, N-channel MOS transistors N1 and N2 concurrently turn on only when internally-generated voltage VBOOST has been raised to a predetermined voltage level (3×Vthp in the present embodiment) and also reference voltage VREF generated based on internally-generated voltage VBOOST has reached a predetermined level. Once N-channel MOS transistors N1, N2 concurrently turn on, a connection node ND40 of resistance R0 and N-channel MOS transistors N1 is driven to the ground voltage ("L" level).

Inverter 10 is connected at its input node to connection node ND40 and connected at its output node to the input node of delay circuit 41. Therefore, an "L" level signal at connection node ND40 is converted into an "H" level signal ENBLF through inverter 10 and is input to delay (DELAY) circuit 41.

Delay circuit 41 delays a signal ENBLF by a predetermined delaying amount and outputs a brief enable signal ENBL. The brief enable signal ENBL is input to a first input node of AND circuit G3.

In summary, brief enable circuit 40 detects that internally-generated voltage VBOOST and reference voltage VREF are concurrently at predetermined voltage levels and generates an "H" level brief enable signal ENBL.

VBOOST voltage dividing circuit 60 includes P-channel MOS transistor P5 and resistances R1, R2 connected in series between internally-generated voltage VBOOST and the ground voltage.

P-channel MOS transistor P5 is connected at its gate to the generating circuit of reset signal RES1, not shown, and turns on in response to reset signal RES1 being inactivated to "L" level. Due to P-channel MOS transistor P5 being turned on, resistances R1 and R2 constitute a voltage dividing circuit. At a connection node ND60 of resistances R1 and R2, there is generated a divided voltage VDIV of internally-generated voltage VBOOST corresponding to the ratio between the respective resistances.

VBOOST detail detection circuit 70 is a section for detecting the voltage level of internally-generated voltage VBOOST more detailedly than VBOOST brief detection circuit 30. As illustrated in FIG. 17, VBOOST detail detection circuit 70 includes a comparator CMP to perform coincidence comparison operation between divided voltage VDIV and reference voltage VREF. When divided voltage VDIV is higher than reference voltage VREF, comparator CMP outputs an "H" level comparison result signal CRES. On the other hand, when divided voltage VDIV is lower than reference voltage VREF, comparator CMP outputs an "L" level comparison result signal CRES.

When brief enable signal ENBL and comparison result signal CRES are input to the first input node and second input node of AND circuit G3, AND circuit G3 outputs the logical multiplication of these two signals. When brief enable signal ENBL is at the "H" level (corresponding to the case where internally-generated voltage VBOOST and reference voltage VREF are equal to or higher than predetermined voltages) and also comparison result signal CRES is at the "H" level (corresponding to the case where the divided voltage of internally-generated voltage VBOOST is equal to or higher than reference voltage VREF), AND circuit G3 outputs an "H" level operation result at its output node. The "H" level output signal is sent to redundant reading control circuit 110 as a reading starting signal START indicating that internally-generated voltage VBOOST has reached a predetermined voltage level and therefore the data reading operation has become possible.

In the aforementioned structure, the electrical potential of internally-generated voltage VBOOST is detected by VBOOST brief detection circuit 30 and VBOOST detail detection circuit 70 and only when both the detecting circuits detect that internally-generated voltage VBOOST is at predetermined voltage levels, reading starting signal START is generated. Such a structure is employed for the following reason.

There is a problem that since none of reference voltage VREF and internally-generated voltage VBOOST may have been generated at power-on, it is not ensured that the comparison results of VBOOST detail detection circuit 70 are correct as such. In order to solve this problem, brief enable circuit 40 must detect in advance that both the internally-generated voltage VBOOST level and reference voltage VREF level have been correctly generated, in order to ensure that VBOOST detail detection circuit 70 sufficiently functions.

Therefore, according to the present embodiment, VBOOST brief detection circuit 30 is provided as a means for detecting that both internally-generated voltage VBOOST and reference voltage VREF have been correctly generated.

While in the present embodiment there has been described an exemplary detection of the voltage level of internally-generated voltage VBOOST using VBOOST brief detection circuit 30 and VBOOST detail detection circuit 70, other power supply voltages required to be detected (for example, the external power supply voltage VCC, the internal power supply voltage INTVCC, and the sub bit line limit voltage VCNST) may be detected using a similar structure.

As described above, according to the sixth embodiment, it is detected that the unstable internally-generated voltage just after power-on has reached a voltage level which enables the data reading and then the reading operation is performed. This enables accurate and stable reading operation of redundant information, improving the efficiency of redundant relief.

Seventh Embodiment

In the present embodiment, there will be suggested a structure for automatically starting the data reading for PROM area PA in response to a reading starting signal START generated from the internal power supply detection circuit described in the sixth embodiment. The present embodiment corresponds to an exemplary structure of redundant reading control circuit 110 illustrated in FIG. 17.

Figure 18:
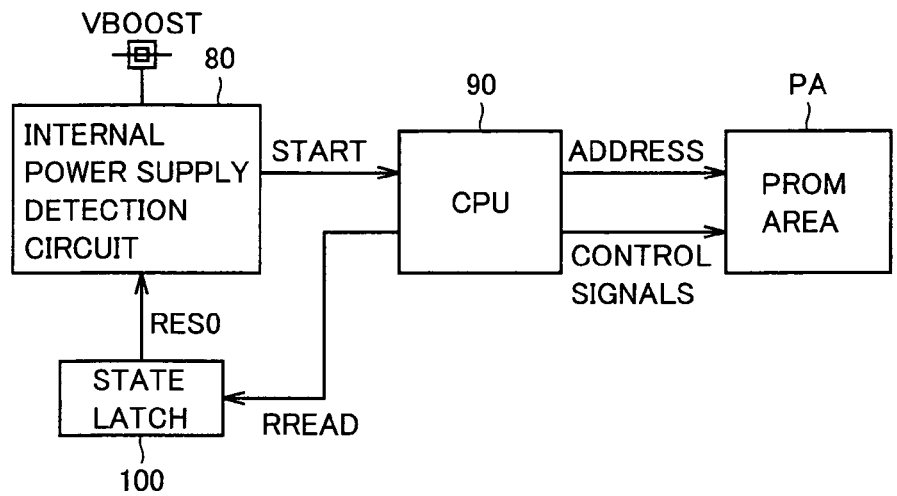
FIG. 18 is a schematic block diagram of the control section for controlling the reading operation for PROM area PA in the nonvolatile semiconductor memory device according to the seventh embodiment of the present invention.

FIG. 18 is a schematic block diagram of the control section for controlling the reading operation for PROM area PA in the nonvolatile semiconductor memory device according to the seventh embodiment of the present invention.

Referring to FIG. 18, the control section includes an internal power supply detection circuit 80, a CPU (Central Processing Unit) 90 and a state latch circuit 100.

Internal power supply detection circuit 80 has the circuit structure illustrated in FIG. 17. Internal power supply detection circuit 80 detects that internally-generated voltage VBOOST reaches a voltage level which enables reading and outputs an activated ("H" level) reading starting signal START.

CPU 90 outputs address signals and various control signals to PROM area PA in response to an "H" level reading starting signal START. In response to these signals, the reading of redundant information for PROM area PA is performed.

CPU 90 further outputs a redundant reading activation signal RREAD in response to a reading starting signal START being activated. Redundant reading activation signal RREAD is a signal which is activated to "H" level during the data reading time period for PROM area PA. This redundant reading activation signal RREAD is sent to state latch circuit 100.

State latch circuit 100 changes its operating state in response to the activation/inactivation of redundant reading activation signal RREAD. A reset signal RES0, which is generated in state latch circuit 100, changes between the activated and inactivated states depending on the change in the operating state. According to the present embodiment, there is stored in state latch circuit 100 information about whether or not trimming is required, realizing automatic reading of redundant information required for the trimming.

Reset signal RES0 generated in state latch circuit 100 is input to internal power supply detection circuit 80. As previously described in the sixth embodiment, internal power supply detection circuit 80 performs the detecting operation in response to reset signal RES0 being inactivated to the "L" level.

Figure 19:
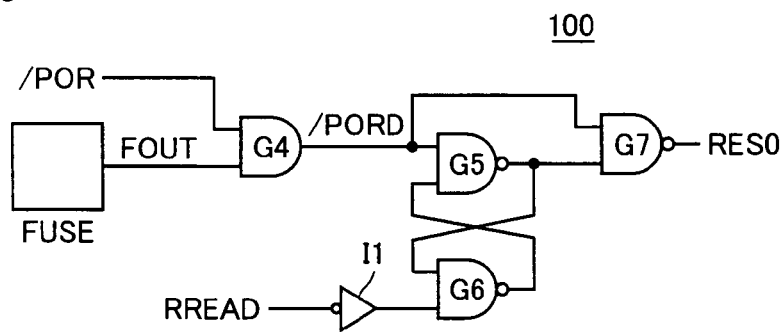
FIG. 19 is a circuit diagram illustrating an exemplary structure of state latch circuit 100 of FIG. 18.

FIG. 19 is a circuit diagram illustrating an exemplary structure of state latch circuit 100 of FIG. 18.

Referring to FIG. 19, state latch circuit 100 includes a program section FUSE for nonvolatily storing information about the trimming, which is input in advance from the outside, an AND circuit G4, a RS latch circuit consisting of NAND circuits G5, G6, an inverter I1 and a NAND circuit G7.

Program section FUSE includes a fuse element as a program element. The fuse element conduct at the initial state and is brought into the unconducted state by blow inputs or the like from the outside. By selecting the presence or absence of blow inputs to the fuse element, one bit of program information may be nonvolatily stored and a program signal FOUT at a level corresponding to the program information may be generated. In the present embodiment, when the trimming is to be performed, an "H" level program signal FOUT may be generated from program section by supplying blow inputs to the fuse element. On the other hand, when the trimming is not to be performed, blow inputs are not supplied to the fuse element and the "L" level program signal FOUT is retained.

On receiving a power-on reset signal /POR at its first input node and the trimming information from program section FUSE at its second input node, AND circuit G4 outputs a signal /PORD as the operation result of the logical multiplication of these two signals. Power-on reset signal /POR is a signal generated in a power-on reset circuit, not shown. Power-on reset signal /POR is inactivated ("L" level) and sets the internal circuit at the initial state, when the power supply voltage has not reached a predetermined voltage level just after power-on. Further, power reset signal /POR is activated ("H" level) and sets the internal circuit at the reset-release state, once the power supply voltage has reached the threshold voltage, after a predetermined time period has elapsed.

Therefore, AND circuit G4 outputs an "L" level signal /PORD in response to an "L" level power-on reset signal /POR for a predetermined time period after power-on. Further, once the power-on reset signal /POR has changed to the "H" level after the predetermined time period has elapsed, AND circuit G4 outputs a "H" or "L" level signal IPORD according to the retained information of program signal FOUT. Namely, AND circuit G4 outputs an "H" level signal /PORD when the trimming is performed, and outputs an "L" level signal /PORD when the trimming is not performed.

The RS latch circuit receives a signal /PORD at a set input terminal and receives the reverse signal of redundant reading activation signal RREAD output from the inverter, at a reset input terminal. The RS latch circuit stores set/reset states according to the input signals.

On receiving signal /PORD at the first input node and receiving a set output from the RS latch circuit at the second input node, NAND circuit G7 outputs reset signal RES0 as the operation result of the logical multiplication of these two signals. Reset signal RES0 is input to internal power supply detection circuit 80, as illustrated in FIG. 18. As illustrated in FIG. 17, in internal power supply detection circuit 80, VBOOST brief detection circuit 30 detects internally-generated voltage VBOOST in response to reset signal RES0.

The reading operation of redundant information for PROM area PA which is performed at the control section having the aforementioned structure will now be described. The reading of redundant information follows the following two patterns of control sequences.

As the first pattern, when the trimming is not to be performed, an "L" level program signal FOUT is nonvolatily prestored, from outside, into program section FUSE in state latch circuit 100. According to the "L" level program signal FOUT, an "L" level signal /PORD is input to the set input terminal of the RF latch circuit in state latch circuit 100.

Here, the reverse signal of an inactivated ("L" level) redundant reading activation signal RREAD is input to the reset input terminal. Therefore, the RS latch circuit outputs an "H" level signal at its set output terminal.

On receiving the "H" level set output signal and an "L" level signal /PORD, NAND circuit G7 outputs an "H" level reset signal RES0.

The "H" level reset signal RES0 is sent to VBOOST brief detection circuit 30 in internal power supply detection circuit 80 illustrated in FIG. 17. Since VBOOST brief detection circuit 30 is maintained at the inactivated state for an "H" level reset signal RES0, internal power supply detection circuit 80 does not output a reading starting signal START and thus the data reading for PROM area PA is not performed.

On the other hand, as the second pattern, when the trimming is to be performed, an "H" level program signal FOUT is nonvolatily prestored, from outside, into program section FUSE in state latch circuit 100.

Figure 20:
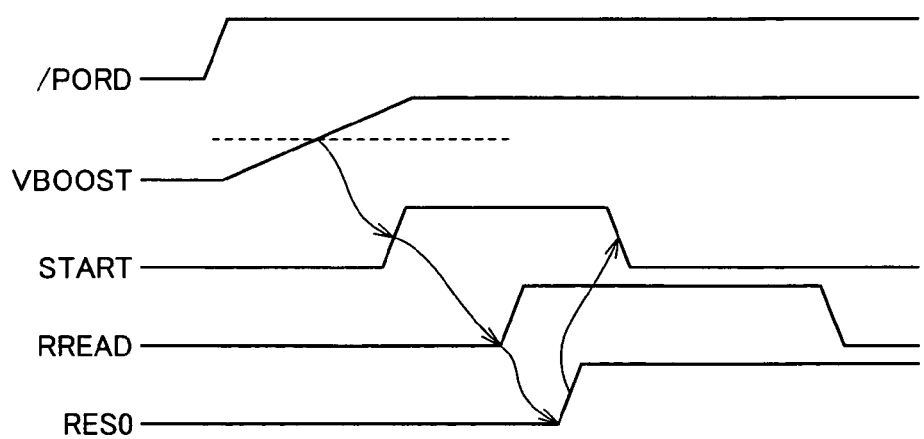
FIG. 20 is an operating waveform diagram for describing the reading operation for PROM area PA in the case where the trimming is performed.

FIG. 20 is an operating waveform diagram for describing the reading operation for PROM area PA in the case where the trimming is performed.

At first, just after power-on, the power-on reset circuit, not shown, outputs an "L" level power-on reset signal /POR. In state latch circuit 100 illustrated in FIG. 17, AND circuit G4 outputs an "L" level signal /PORD on receiving the "L" level power-on reset signal /POR and an "H" level program signal FOUT.

In the RS latch circuit, an "L" level signal /PORD is input to the set input terminal and the reverse signal of an "L" level redundant reading activation signal is input to the reset input terminal. Consequently, the set output of the RS latch circuit is at the "H" level.

In response to the "H" level set output and an "L" level signal /PORD, NAND circuit G7 outputs an "H" level reset signal RES0. Internal power supply detection circuit 80 is maintained at the inactivated state according to the "H" level reset signal RES0.

Then, once power-on reset signal /POR is changed to the "H" level after a predetermined time has elapsed, AND circuit G4 outputs an "H" level signal /PORD.

On receiving the "H" level signal /PORD at the set input terminal and the reverse signal of an "L" level redundant reading activation signal RREAD at the reset input terminal, the RS latch circuit maintains the "H" level set output. NAND circuit G7 outputs an "L" level reset signal RES0 in response to the "H" level set output and the "H" level signal /PORD. Internal power supply detection circuit 80 is brought into the activated state in response to the "L" level reset signal RES0 and performs the detection of internally-generated voltage VBOOST.

Then, internal power supply detection circuit 80 detects that internally-generated voltage VBOOST reaches a predetermined voltage level and outputs an "H" level reading starting signal START. The reading starting signal START is sent to CPU 90, as illustrated in FIG. 18.

In response to the activated reading starting signal START, CPU 90 outputs an "H" level, activated redundant reading activation signal RREAD. At this time, CPU 90 outputs address signals and control signals to PROM area PA to perform the data reading operation.

In state latch circuit 100, the "H" level redundant reading activation signal RREAD is reversed through the inverter and then input to the reset input terminal of the RS latch circuit. On receiving the "H" level signal /PORD at the set input terminal and the reverse signal of the "H" level redundant reading activation signal RREAD at the reset input terminal, the RS latch circuit changes to the reset state and thus the set output thereof is changed to the "L" level.

In response to the "L" level set output and the "H" level signal /PORD, NAND circuit G7 outputs an "H" level reset signal RES0.

Then, since the reset signal RES0 is changed from the "L" level to the "H" level, internal power supply detection circuit 80 is inactivated, and thus the reading start signal START is reset to the "L" level from the "H" level.

Finally, once the data reading operation for PROM area PA has been completed, CPU 90 inactivates the redundant reading activation signal RREAD to the "L" level.

As described above, according to the seventh embodiment of the present invention, it becomes possible to automatically perform the reading of redundant information for the PROM by utilizing trimming information indicating whether or not trimming is required, in conjunction with the reading starting signals output as the detection results from the internal power supply detection circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

an memory array including a plurality of normal memory cells and a plurality of redundant memory cells for substitution relief of defective memory cells among said plurality of normal memory cells, said plurality of normal memory and said plurality of redundant memory cells being arranged in a matrix shape;

a program circuit for storing redundant information for use in substitution relief, which is placed adjacent to said memory array in the direction of the memory cell columns;

said program circuit comprising a plurality of program cells arranged in a matrix shape and having the same structure as that of said normal memory cells, a plurality of sub bit lines provided in correspondence with the respective columns of said program cells, a plurality of program word lines provided in correspondence with the respective rows of said program cells, main bit lines which are shared by said normal memory cells and said program cells, and redundant reading bit lines for reading said redundant information from said program circuit, a first connecting circuit for electrically connecting said main bit lines with selected sub bit lines designated to be written, of said plurality of sub bit lines, in program information writing operation for writing said redundant information into said program circuit, and a second connecting circuit for electrically connecting said redundant reading bit lines with selected sub bit lines designated to be read, of said plurality of sub bit lines, in program information reading operation for reading said redundant information from said program circuit before data reading operation.

2. The nonvolatile semiconductor memory device according to claim 1, wherein said first connecting circuit is placed between said memory array and said program circuit to selectively connect one end of each of said plurality of sub bit lines in the direction of extension with said main bit lines, and said second connecting circuit is placed opposite to said first connecting circuit such that said first and second connecting circuits sandwich said program circuit to selectively connect the other end of each of said plurality of sub bit lines in the direction of extension with said redundant reading bit lines.

3. The nonvolatile semiconductor memory device according to claim 2, further comprising:
an erasing pulse applying circuit for applying erasing pulses collectively to a plurality of cells to be erased, said erasing pulse applying circuit being shared by said plurality of normal memory cells, said plurality of redundant memory cells and said plurality of program cells; and
an erasing pulse control circuit for controlling the applying time and applied voltage of said erasing pulses, in response to a program cell selection signal indicating that said plurality of program cells are selected to be erased, in program information erasing operation for erasing said redundant information from said program circuit, wherein
said erasing pulse control circuit sets the applying time of said erasing pulses to be longer than the applying time for said plurality of normal memory cells and said plurality of redundant memory cells and sets the applied voltage of said erasing pulses to a voltage higher than the applied voltage for said plurality of normal memory cells and said plurality of redundant memory cells, in response to said program cell selection signal.

4. The nonvolatile semiconductor memory device according to claim 3, further comprising:
an erasure determination circuit for verifying that a plurality of cells to be erased have been all erased, using an erasure determination voltage as the reference;
an over-erasure determination circuit for detecting over-erased cells using an over-erasure determination voltage as the reference, once it is verified that said plurality of cells to be erased have been erased; and
a determination voltage control circuit for controlling said erasure determination voltage and said over-erasure determination voltage, wherein
said determination voltage control circuit sets said erasure determination voltage and said over-erasure determination voltage to voltages lower than those for said plurality of normal memory cells and said plurality of redundant memory cells, in response to said program cell selection signal.

5. The nonvolatile semiconductor memory device according to claim 4, wherein
said plurality of program word lines includes a first and second program word lines, said program cells in the row corresponding to said first program word line are electrically connected to the respective corresponding ones of said second sub bit lines, and said program cells in the row corresponding to said second program word line are not electrically connected to the respective corresponding ones of said second sub bit lines.

6. The nonvolatile semiconductor memory device according to claim 5, wherein
in said program information reading operation, said first program word line is activated to read said redundant information from the program cells corresponding to said selected sub bit lines.

7. The nonvolatile semiconductor memory device according to claim 6, wherein in said program information writing operation, one bit of said redundant information is stored in one or two said program cells connected to a first said selected sub bit line, and one bit of said redundant information, which is complimentary to that stored in said program cells connected to said first said selected sub bit line, is stored in one or two said program cells connected to a second said selected sub bit line, said semiconductor memory device further comprises;
a first and second redundant data line for transferring said one bit of complimentary information;
a selecting circuit for electrically connecting said first and second selected sub bit lines with said first and second redundant data lines, respectively; and
a sense amplifier for reading the data corresponding to the difference between the current through said first redundant data line and the current through said second redundant data line.

8. The nonvolatile semiconductor memory device according to claim 7, wherein
said sense amplifier includes
source follower transistors for converting the difference between the current through said first redundant data line and the current through said second redundant data line into a voltage difference, said source follower transistors being connected between a power supply voltage and said first and second redundant data lines, respectively, and
a differential amplifier for differentially amplifying the voltage difference between said first and second redundant data lines.

9. The nonvolatile semiconductor memory device according to claim 8, further comprising:
an internal power supply detection circuit for detecting an internally-generated voltage which generates in response to power-on and is applied to selected program word lines selected to be read, of said plurality of program word lines; and
a reading control circuit for performing/stopping the reading operation for said redundant information for said program circuit, wherein
said internal power supply detection circuit detects, after power-on, that said internally-generated voltage reaches an activation voltage level which drives said selected word lines to an activated state and outputs a reading starting signal commanding starting of reading of said redundant information, and said reading control circuit performs reading operation for said redundant information, in response to said reading starting signal.

10. The nonvolatile semiconductor memory device according to claim 9, wherein
said internal power supply detection circuit includes:
a brief detection circuit for detecting that said internally-generated voltage exceeds a predetermined voltage level, after power-on, in response to a reset signal for initializing inactivated said reading starting signal, and outputs an activated brief detection signal;
a reference voltage generating circuit for generating a reference voltage corresponding to a divided voltage of said activation voltage, based on said internally-generated voltage;
a voltage-dividing circuit for generating a divided voltage of said internally-generated voltage;
a brief enable circuit for outputting an activated enable signal in response to said brief detection signal being activated and said reference voltage being correctly generated;

a detail detection circuit for detecting that the divided voltage of said internally-generated voltage reaches said reference voltage by comparing the divided voltage of said internally-generated voltage with said reference voltage, and then outputting an activated detail detection signal; and a logical gate circuit for outputting an activated said reading starting signal in response to both said enable signal and said detail detection signal being activated.

11. The nonvolatile semiconductor memory device according to claim 10, further comprising:

a latch circuit for retaining said redundant information about whether or not substitution relief is required, wherein said latch circuit activates or inactivates said reset signal according to whether or not substitution relief is required, and outputs an activated or inactivated said reset signal, at power-on, said internal power supply detection circuit starts the detection of said internally-generated voltage, in response to an inactivated said reset signal, and outputs an activated said reading starting signal on detecting that said internally-generated voltage reaches said activation voltage, and said reading control circuit starts the reading operation for said redundant information in response to an activated said reading starting signal.

12. The nonvolatile semiconductor memory device according to claim 11, wherein said reading control circuit outputs an activated redundant reading activation signal in response to the reading operation for said redundant information for said program circuit being started, said latch circuit activates said reset signal in response to said redundant reading activation signal being activated and outputs an activated said reset signal, and said internal power supply detection circuit stops the detection of said internally-generated voltage and inactivates said reading starting signal, in response to an activated said reset signal.

13. A nonvolatile semiconductor memory device comprising:

a normal memory cell area including a plurality of nonvolatile memory cells arranged in a matrix shape, a plurality of first sub bit lines provided in correspondence with the respective columns of said plurality of nonvolatile memory cells, and a plurality of word lines provided in correspondence with the respective rows of said plurality of nonvolatile memory cells;

a redundant memory cell area including a plurality of redundant memory cells for substitution relief of defective memory cells in said normal memory cell area, said plurality of redundant memory cells being arranged in a matrix shape;

a program cell area including a plurality of nonvolatile program cells for storing redundant information for use in said substitution relief, said program cell area being placed adjacent to said normal memory cell area in the direction of memory cell columns, and said plurality of nonvolatile program cells being arranged in a matrix shape;

said program cell area including a plurality of second sub bit lines provided in correspondence with the respective columns of said plurality of program cells, and a plurality of program word lines provided in correspondence with the respective rows of said plurality of program cells;

main bit lines extended over said normal memory cell area in the direction of said columns and are selectively connected to said first sub bit lines;

a first select gate circuit for electrically connecting said main bit lines with said second sub bit lines designated to be written, in program information writing operation for writing said redundant information into said program circuit, said first select gate circuit being placed between said normal memory cell area and said program cell area, redundant information reading bit lines for reading said redundant information from said program cells; and a second select gate circuit for electrically connecting said redundant reading bit lines with said second sub bit lines designated to be read, in program information reading operation for reading said redundant information from said program cells, said second select gate circuit being placed opposite to said first select gate circuit such that said first and second select gate circuits sandwich said program area.

14. The nonvolatile semiconductor memory device according to claim 13, wherein said plurality of first sub bit lines and said plurality of second sub bit lines are arranged with the substantially the same pitch, said plurality of first sub bit lines includes a first group of sub bit lines each of which is selectively connected to said main bit lines at one ends of said first sub bit lines in the direction of extension; and a second group of sub bit lines each which is selectively connected to said main bit lines at the other ends of said first sub bit lines in the direction of extension;

a third select gate circuit for selectively connecting said first sub bit lines in said first group with said main bit lines, said third select gate circuit being placed opposite to said program cell area such that said program cell area and said third select gate circuit sandwich said normal memory cell area;

a fourth select gate circuit for selectively connecting said first sub bit lines in said second group with said main bit lines, said fourth select gate circuit being placed between said normal memory cell area and said first select gate circuit; and the number of said first sub bit lines connected to said main bit lines through said third select gate circuit is equal to the number of said second sub bit lines connected to said main bit lines through said first select gate circuit, and said plurality of second sub bit lines includes dummy sub bit lines which are not connected to said first and second select gate circuits.

15. The nonvolatile semiconductor memory device according to claim 14, wherein said plurality of program word lines includes a first and second program word lines, said program cells in the row corresponding to said first program word line are electrically connected to the respective corresponding ones of said second sub bit lines, and said program cells in the row corresponding to said second program word line are not electrically connected to the respective corresponding ones of said second sub bit lines.

* * * * *